(12) United States Patent
Kinoshita et al.

(10) Patent No.: US 7,858,286 B2
(45) Date of Patent: Dec. 28, 2010

(54) POSITIVE RESIST COMPOSITION AND METHOD FOR FORMING RESIST PATTERN

(75) Inventors: Yohei Kinoshita, Kawasaki (JP); Makiko Irie, Kawasaki (JP); Waki Ohkubo, Kawasaki (JP); Yusuke Nakagawa, Kawasaki (JP); Shinichi Hidesaka, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 266 days.

(21) Appl. No.: 11/913,308

(22) PCT Filed: Apr. 7, 2006

(86) PCT No.: PCT/JP2006/307486
§ 371 (c)(1),
(2), (4) Date: Oct. 31, 2007

(87) PCT Pub. No.: WO2006/123487
PCT Pub. Date: Nov. 23, 2006

(65) Prior Publication Data
US 2009/0098483 A1    Apr. 16, 2009

(30) Foreign Application Priority Data
May 19, 2005    (JP)    .............. 2005-146859

(51) Int. Cl.
G03F 7/039    (2006.01)
G03F 7/20    (2006.01)
G03F 7/30    (2006.01)

(52) U.S. Cl. ............ 430/270.1; 430/326; 430/910; 430/921; 430/919; 430/920; 430/922; 430/925

(58) Field of Classification Search .............. None
See application file for complete search history.

(56) References Cited

U.S. PATENT DOCUMENTS

| | | | |
|---|---|---|---|
| 6,596,458 B1 | 7/2003 | Sato et al. | |
| 6,753,126 B2 | 6/2004 | Park et al. | |
| 7,105,268 B2 | 9/2006 | Funaki et al. | |
| 2001/0008739 A1 | 7/2001 | Nishiyama et al. | |
| 2003/0194640 A1 | 10/2003 | Sato | |
| 2003/0232273 A1 | 12/2003 | Adams et al. | |
| 2005/0227174 A1* | 10/2005 | Hatakeyama et al. | .... 430/270.1 |
| 2006/0147832 A1 | 7/2006 | Hada et al. | |
| 2008/0166655 A1* | 7/2008 | Ogata et al. | .............. 430/270.1 |

FOREIGN PATENT DOCUMENTS

| | | |
|---|---|---|
| EP | 1717261 A1 | 11/2006 |
| JP | 4039665 | 2/1992 |
| JP | 2001-318465 | 11/2001 |
| JP | 2001335535 | 12/2001 |
| JP | 2002-363225 | 12/2002 |
| JP | 2003-241379 | 8/2003 |
| JP | 2003-295444 | 10/2003 |
| WO | WO 02/48217 A1 | 6/2002 |
| WO | WO 2004069959 | 8/2004 |
| WO | WO 2004/078803 A1 | 9/2004 |
| WO | WO2005/080473 A1 * | 9/2005 |
| WO | WO 2005123655 | 12/2005 |
| WO | WO 2005123795 | 12/2005 |

OTHER PUBLICATIONS

Ogata et al., Effects of Protecting Group on Resist Characteristics of Acryl Polymers for 193 nm Lithography, Journal of Photopolymer Science and Technology, vol. 17, No. 4, 2004, p. 483-488.
International Search Report from PCT/JP2006/307486, mailed Jun. 27, 2006.
Office Action cited in corresponding Japanese Patent Application No. 2005-146859, dated Nov. 9, 2010.

* cited by examiner

*Primary Examiner*—Sin J. Lee
(74) *Attorney, Agent, or Firm*—Knobbe, Martens, Olson & Bear, LLP

(57) ABSTRACT

A positive resist composition and method for forming a resist pattern are provided which enable a resist pattern with excellent shape to be obtained. The resist composition includes a resin component (A) which exhibits increased alkali solubility under action of acid, an acid-generator component (B) which generates acid upon irradiation and an organic solvent (S) in which the components (A) and (B) are dissolved, the resin component (A) including a copolymer (A1) containing: a structural unit (a1) having an acetal-type protected group, a structural unit (a2) derived from an acrylate ester having a lactone-containing polycyclic group, which is represented by general formula (a2-1) shown below; and a structural unit (a3) derived from an acrylate ester having a polar group-containing aliphatic hydrocarbon group:

[Chemical Formula 1]

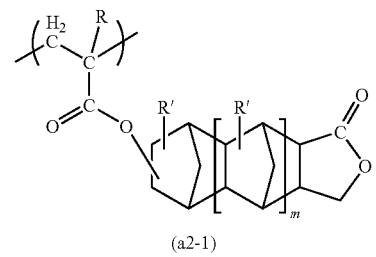

(a2-1)

wherein R represents a hydrogen atom, a fluorine atom, a lower alkyl group or a fluorinated lower alkyl group; R' represents a hydrogen atom, a lower alkyl group or an alkoxy group of 1 to 5 carbon atoms; and m represents 0 or 1.

5 Claims, No Drawings

POSITIVE RESIST COMPOSITION AND METHOD FOR FORMING RESIST PATTERN

RELATED APPLICATIONS

This application is the U.S. National Phase filing under 35 U.S.C. §371 of PCT/JP2006/307486, filed Apr. 7, 2006, which designated the United States and was published in a language other than English, which claims priority under 35 U.S.C. §119(a)-(d) to Japanese Patent Application No. 2005-146859, filed May 19, 2005. The content of these applications is incorporated herein by reference in their entireties.

TECHNICAL FIELD

The present invention relates to a positive resist composition and a method for forming a resist pattern.

BACKGROUND ART

In recent years, in the production of semiconductor elements and liquid crystal display elements, advances in lithography techniques have lead to rapid progress in the field of miniaturization.

Typically, these miniaturization techniques involve shortening the wavelength of the exposure light source.

Conventionally, ultraviolet radiation typified by g-line and i-line radiation has been used, but nowadays KrF excimer lasers (248 nm) are the main light source used in mass production, and ArF excimer lasers (193 nm) are now also starting to be introduced in mass production.

Furthermore, research is also being conducted into lithography techniques that use $F_2$ excimer lasers (157 nm), EUV (extreme ultraviolet radiation), and EB (electron beams) and the like as the light source (radiation source).

Resists for use with these types of short wavelength light sources require a high resolution capable of reproducing patterns of minute dimensions, and a high level of sensitivity to these types of short wavelength light sources.

One example of a known resist that satisfies these conditions is a chemically amplified resist, which includes a base resin and an acid generator (hereafter referred to as a PAG) that generates acid on exposure. These chemically amplified resists include positive resists in which the alkali solubility of the exposed portions increases, and negative resists in which the alkali solubility of the exposed portions decreases.

Until recently, polyhydroxystyrene (PHS) or derivative resins thereof in which the hydroxyl groups are protected with acid-dissociable, dissolution-inhibiting groups (PHS-based resins), which exhibit high transparency relative to a KrF excimer laser (248 nm), have been used as the base resin component of chemically amplified resists.

However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm n.

As a result, resins that contain structural units derived from (meth)acrylate esters within the principal chain (acrylic resins) are now widely used as base resins for resists that use ArF excimer laser lithography, as they exhibit excellent transparency in the vicinity of 193 nm.

Further, as positive resists, as shown in Patent Document 1, resins having a structural unit derived from a tertiary ester compound of (meth)acrylic acid such as 2-alkyl-2-adamantyl (meth)acrylate as a structural unit having an acid dissociable, dissolution inhibiting group are mainly used.

In these resins, it is known that the dissolution energy of the acid dissociable, dissolution inhibiting group is high, and hence, the types of usable acid generators are limited. Specifically, these resins had problems in that, when an acid generator which is capable of generating a strong acid such as an onium salt having a fluorinated alkylsulfonate ion as the anion moiety is not used, the acid dissociable, dissolution inhibiting groups cannot be satisfactorily dissociated. As a result, the resin could not function as a resist.

Further, in recent years, as resins having an acid dissociable, dissolution inhibiting group which are usable in ArF excimer laser lithography and the like, attention has been drawn to resins having a structural unit in which the hydrogen atom of (meth)acrylic acid is replaced by an acetal group such as 1-alkoxyalkyl group (see Non-Patent Document 1).

[Patent Document I] Japanese Patent (Granted) Publication No. 2,881,969

[Non-Patent Document 1] J. Photopolym. Sci. Technol. 17 (2004) 483-488

DISCLOSURE OF INVENTION

Means to Solve the Problems

With respect to resins having an acetal group as an acid dissociable, dissolution inhibiting group, the acid dissociable, dissolution inhibiting group exhibits low dissolution energy, as compared to the above-mentioned resins having a structural unit derived from a tertiary ester compound. For this reason, it is presumed that the acetal group contributes to enhancing the sensitivity of the resin.

However, when a resist pattern is formed using a positive resist composition containing a resin having an acetal group as an acid dissociable, dissolution inhibiting group, the shape of the resist pattern tends to become poor. More specifically, problems are caused in that spreading of the resist pattern (footing) occurs especially at the substrate interface, and the rectangularity of the resist pattern becomes poor.

The present invention takes the above circumstances into consideration, with an object of providing a positive resist composition capable of forming a resist pattern having an excellent shape, and a method for forming a resist pattern.

Means to Solve the Problems

As a result of extensive and intensive studies, the present inventors found that the above-mentioned problems can be solved by using a copolymer having a specific structural unit containing lactone. The present invention has been completed based on this finding.

Specifically, the first aspect of the present invention is a positive resist composition including a resin component (A) which exhibits increased alkali solubility under action of acid, an acid-generator component (B) which generates acid upon irradiation and an organic solvent (S) in which said components (A) and (B) are dissolved, the resin component (A) including a copolymer (A1) including:

a structural unit (a1) which is at least one member selected from the group consisting of structural units represented by general formula (a1-2) or (a1-4) shown below:

[Chemical Formula 1]

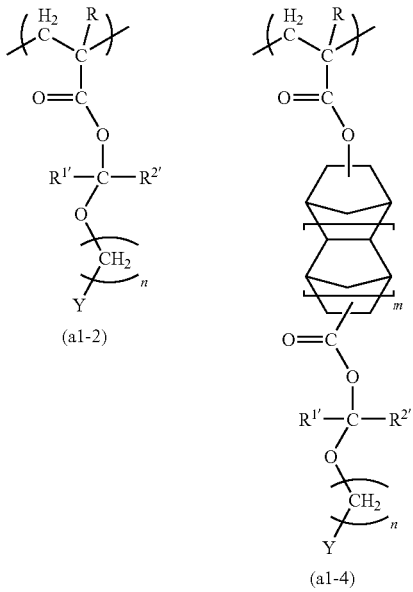

(a1-2)

(a1-4)

wherein Y represents a lower alkyl group or an aliphatic cyclic group; n represents 0 or an integer of 1 to 3; m represents 0 or 1; R represents a hydrogen atom, a fluorine atom, a lower alkyl group or a fluorinated lower alkyl group; and $R^{1'}$ and $R^{2'}$ each independently represents a hydrogen atom or a lower alkyl group;

a structural unit (a2) derived from an acrylate ester having a lactone-containing polycyclic group, which is represented by general formula (a2-1) shown below:

[Chemical Formula 2]

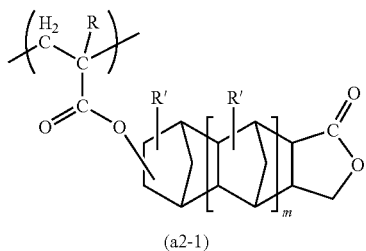

(a2-1)

wherein R represents a hydrogen atom, a fluorine atom, a lower alkyl group or a fluorinated lower alkyl group; R' represents a hydrogen atom, a lower alkyl group or an alkoxy group of 1 to 5 carbon atoms; and m represents 0 or 1; and a structural unit (a3) derived from an acrylate ester having a polar group-containing aliphatic hydrocarbon group.

The second aspect of the present invention is a method for forming a resist pattern, including: applying a positive resist composition according to the first aspect to a substrate to form a resist film on the substrate; conducting exposure of the resist film; and developing the resist film to form a resist pattern.

In the present invention, the term "structural unit" refers to a monomer unit that contributes to the formation of a polymer (resin).

The term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group on the α-position). As the substituent, a halogen atom such as a fluorine atom, an alkyl group, or a halogenated alkyl group can be mentioned.

With respect to the "structural unit derived from an acrylate ester", the "α-position (the carbon atom on the α-position)" refers to the carbon atom having the carbonyl group bonded thereto, unless specified otherwise.

An "alkyl group" includes linear, branched or cyclic, monovalent saturated hydrocarbon.

The term "exposure" is used as a general concept that includes irradiation with any form of radiation.

EFFECT OF THE INVENTION

According to the present invention, there are provided a positive resist composition which enable formation of a resist pattern having an excellent shape and a method of forming a resist pattern.

BEST MODE FOR CARRYING OUT THE INVENTION

<<Positive Resist Composition>>

The positive resist composition of the present invention includes a resin component (A) (hereafter, frequently referred to as "component A") which exhibits increased alkali solubility under action of acid, an acid-generator component (B) (hereafter, frequently referred to as "component (B)") which generates acid upon irradiation and an organic solvent (S) in which the components (A) and (B) are dissolved.

In the positive resist composition of the present invention, the component (A) is alkali-insoluble prior to exposure. When the acid generated from the component (B) upon exposure acts on the component (A), the acid dissociable, dissolution inhibiting group is dissociated and the alkali-solubility of the entire component (A) is enhanced. As a result, the positive resist composition changes from alkali-insoluble to alkali soluble.

Therefore, in the formation of a resist pattern, when the positive resist composition is subjected to selective exposure, the exposed area becomes soluble in an alkali, while the unexposed area remains alkali-insoluble, and hence a resist pattern can be formed by developing with an alkali.

<Component (A)>

In the present invention, the component (A) includes a copolymer (A1) having the structural unit (a1), the structural unit (a2) derived from an acrylate ester having a lactone-containing polycyclic group which is represented by general formula (a2-1) shown above, and the structural unit (a3) derived from an acrylate ester having a polar group-containing aliphatic hydrocarbon group.

—Structural Unit (a1)

The structural unit (a1) is at least one member selected from the group consisting of structural units represented by general formula (a1-2) or (a1-4) shown above.

The structural unit (a1) has an acetal group-type (alkoxyalkyl group-type) acid dissociable, dissolution inhibiting group represented by the formula: $-C(R^{1'})(R^{2'})-O-(CH_2)_n-Y$ bonded to the terminal oxygen atom of the carbonyloxy group ($-C(O)-O-$) derived from the carboxy group.

The above-mentioned acid dissociable, dissolution inhibiting group exhibits a low dissolution energy (deprotection energy) as compared to a conventional acid dissociable, dissolution inhibiting group such as a tertiary alkyl group (e.g., a 2-alkyl-2-adamantyl group), and hence, fine patterns can be resolved.

In general formulas (a1-2) and (a1-4), R represents a hydrogen atom, a fluorine atom, a lower alkyl group or a fluorinated lower alkyl group.

The lower alkyl group as R is preferably an alkyl group of 1 to 5 carbon atoms, and more preferably a linear or branched alkyl group. Examples of the alkyl groups include a methyl group, an ethyl group, a propyl group, an isopropyl group, an n-butyl group, an isobutyl group, a tert-butyl group, a pentyl group, an isopentyl group and a neopentyl group. Among these, a methyl group is industrially preferable.

The fluorinated lower alkyl group is preferably a lower alkyl group of 1 to 5 carbon atoms in which some or all of the hydrogen atoms are substituted with fluorine atoms. Among these, those which have all of the hydrogen atoms fluorinated is preferable.

As a fluorinated lower alkyl group, a linear or branched fluorinated lower alkyl group is more preferable, a trifluoromethyl group, a hexafluoroethyl group, a heptafluoropropyl group or a nonafluorobutyl group is still more preferable, and a trifluoromethyl group (—$CF_3$) is most preferable.

As R, a hydrogen atom, a trifluoromethyl group or a methyl group is preferable, and a methyl group is more preferable.

$R^{1'}$ and $R^{2'}$ each independently represents a hydrogen atom or a lower alkyl group.

As the lower alkyl group for $R^{1'}$ and $R^{2'}$, any of those which are the same as the lower alkyl groups for R can be exemplified. In the present invention, in consideration of suppressing pattern collapse, it is preferable that at least one of $R^{1'}$ and $R^{2'}$ be a hydrogen atom, and it is more preferable that both of $R^{1'}$ and $R^{2'}$ are hydrogen atoms.

n represents 0 or an integer of 1 to 3, preferably 0 or an integer of 1 or 2, more preferably 0 or 1, and most preferably 1.

Y represents a lower alkyl group or an aliphatic cyclic group.

As the lower alkyl group for A, any of those which are the same as the lower alkyl groups for R can be exemplified.

As the aliphatic cyclic group for Y, any one can be appropriately selected from monocyclic and polycyclic groups proposed for use in a conventional ArF resist or the like.

In the present description and claims, the term "aliphatic" is a relative concept used in relation to the term "aromatic", and defines a group or compound that has no aromaticity.

Further, the term "aliphatic cyclic group" refers to a monocyclic group or polycyclic group that has no aromaticity.

An aliphatic cyclic group may or may not have a substituent.

Examples of the substituent include lower alkyl groups of 1 to 5 carbon atoms, a fluorine atom, fluorinated lower alkyl groups of 1 to 5 carbon atoms, and an oxygen atom (=O).

An aliphatic cyclic group may be a hydrocarbon group (alicyclic group) in which the basic ring exclusive of substituents is constituted from only carbon and hydrogen, or a heterocyclic group in which some of the carbon atoms constituting the ring of the alicyclic group are replaced by hetero atoms (e.g., oxygen atom or nitrogen atom). The aliphatic cyclic group is preferably an alicyclic group.

The aliphatic cyclic group may be either saturated or unsaturated, but is preferably saturated.

Examples of aliphatic cyclic groups include monocyclic groups of 5 to 7 carbon atoms and polycyclic groups of 10 to 16 carbon atoms.

As aliphatic monocyclic groups of 5 to 7 carbon atoms, groups in which one hydrogen atom has been removed from a monocycloalkane may be exemplified. Specific examples of such aliphatic monocyclic groups include groups in which one hydrogen atom has been removed from cyclopentane or cyclohexane.

As aliphatic polycyclic groups of 10 to 16 carbon atoms, groups in which one hydrogen atom has been removed from a bicycloalkane, tricycloalkane or tetracycloalkane may be exemplified. Specific examples of such aliphatic polycyclic groups include groups in which one hydrogen atom has been removed from a polycycloalkane such as adamantane, norbornane, isobornane, tricyclodecane or tetracyclododecane. Of these, aliphatic polycyclic groups are preferable, and in consideration of industrial applications, an adamantyl group, a norbonyl group or a tetracyclodecanyl group is preferable, although an adamantyl group is particularly desirable.

As specific examples of acid dissociable, dissolution inhibiting groups represented by general formula: —$C(R^{1'})(R^{2'})$—$O(CH_2)_n$—Y within formulas (a1-2) and (a1-4) shown above, those having structures represented by the following chemical formulas may be exemplified.

Structural formula group (a1-i):

[Chemical Formula 3]

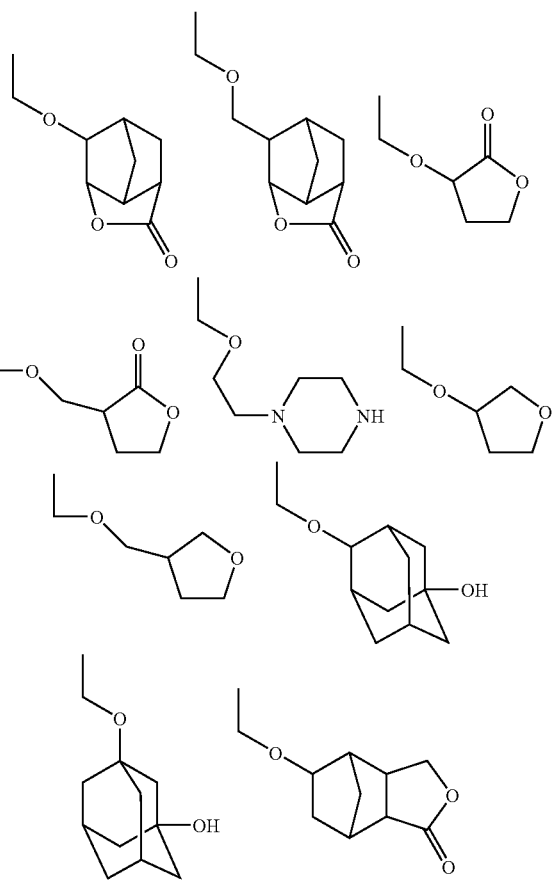

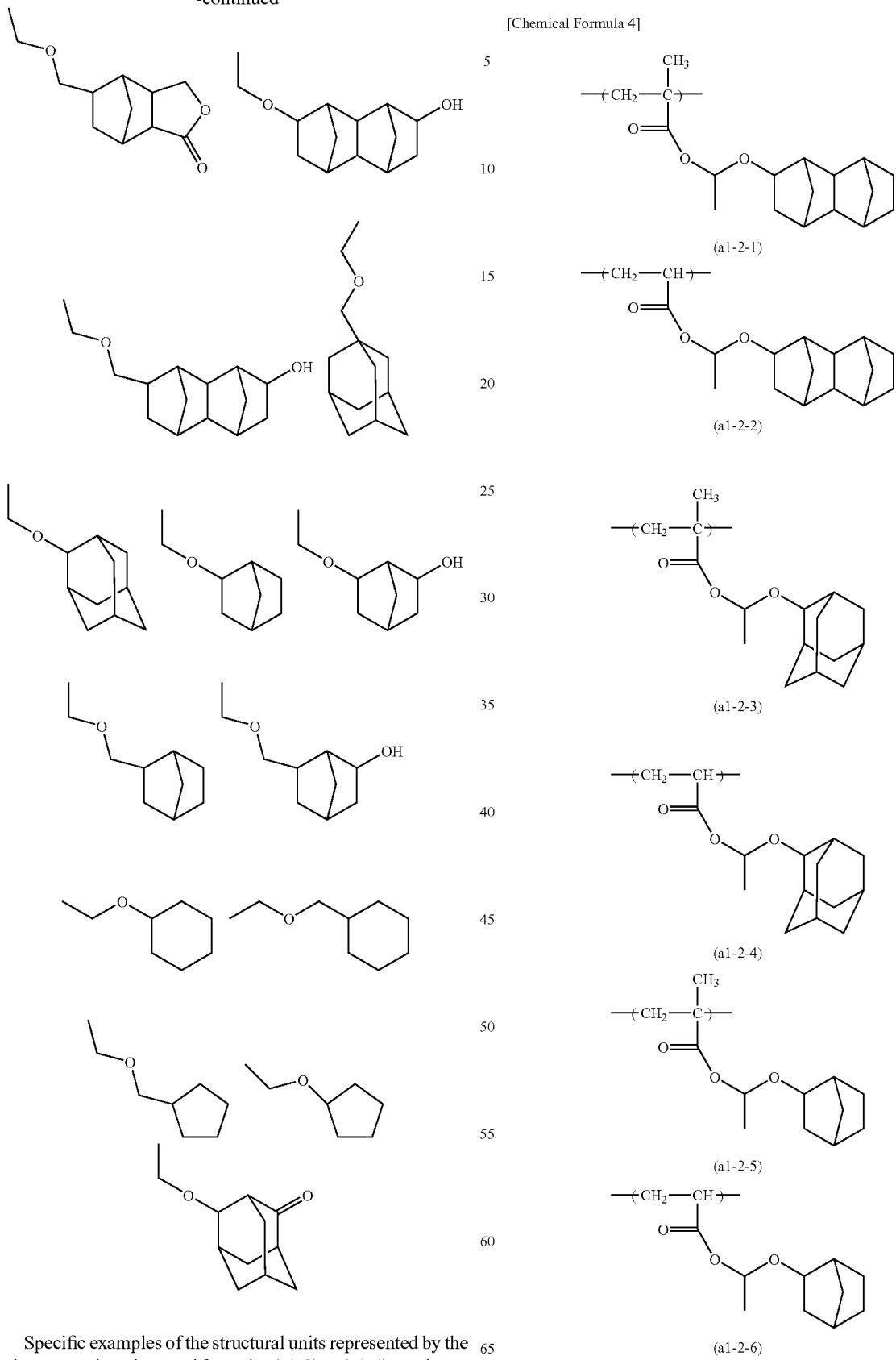
Specific examples of the structural units represented by the above-mentioned general formulas (a1-2) or (a1-4) are shown below.

[Chemical Formula 5]
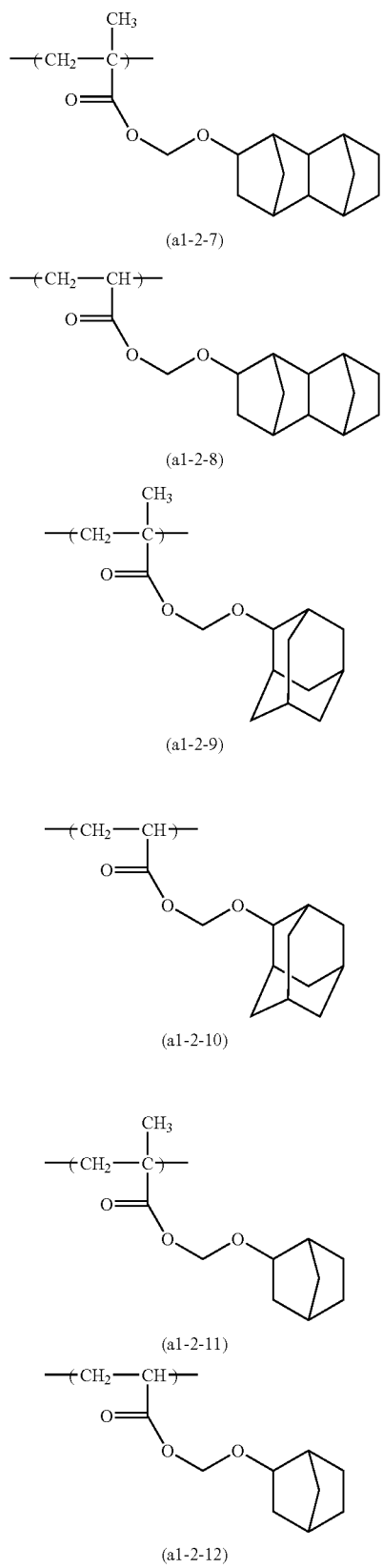
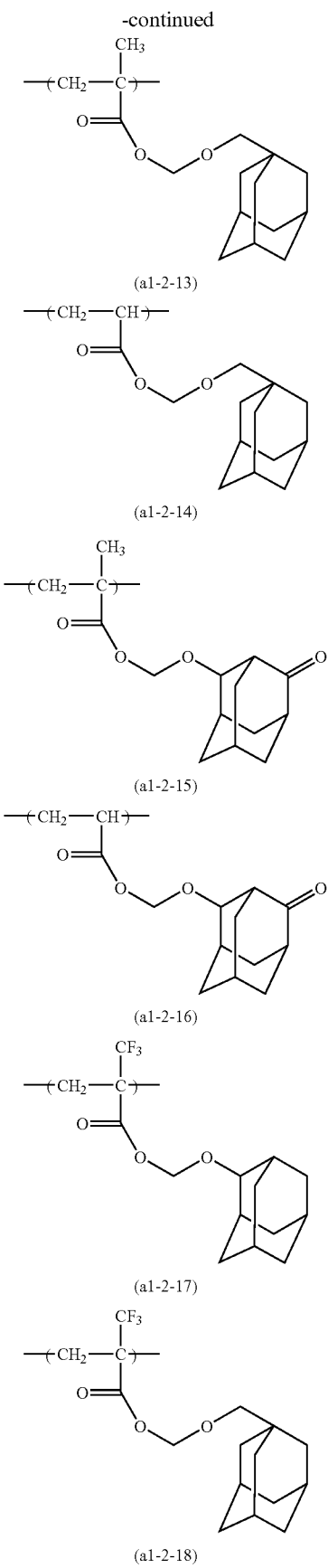

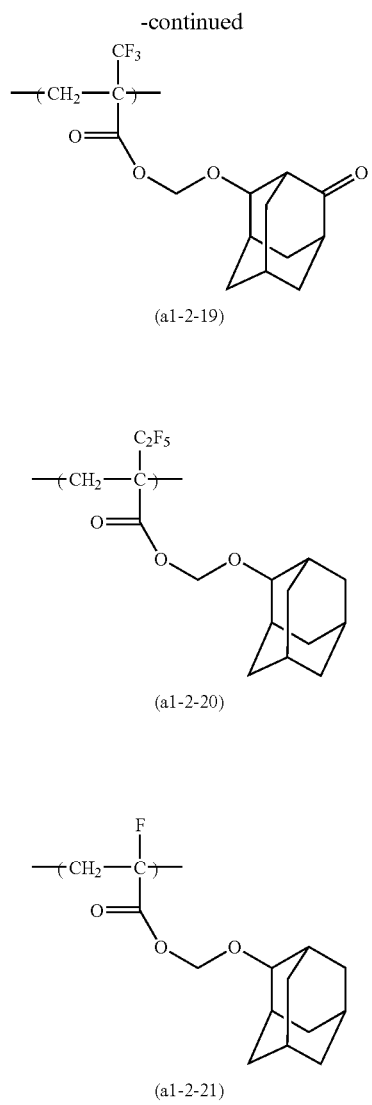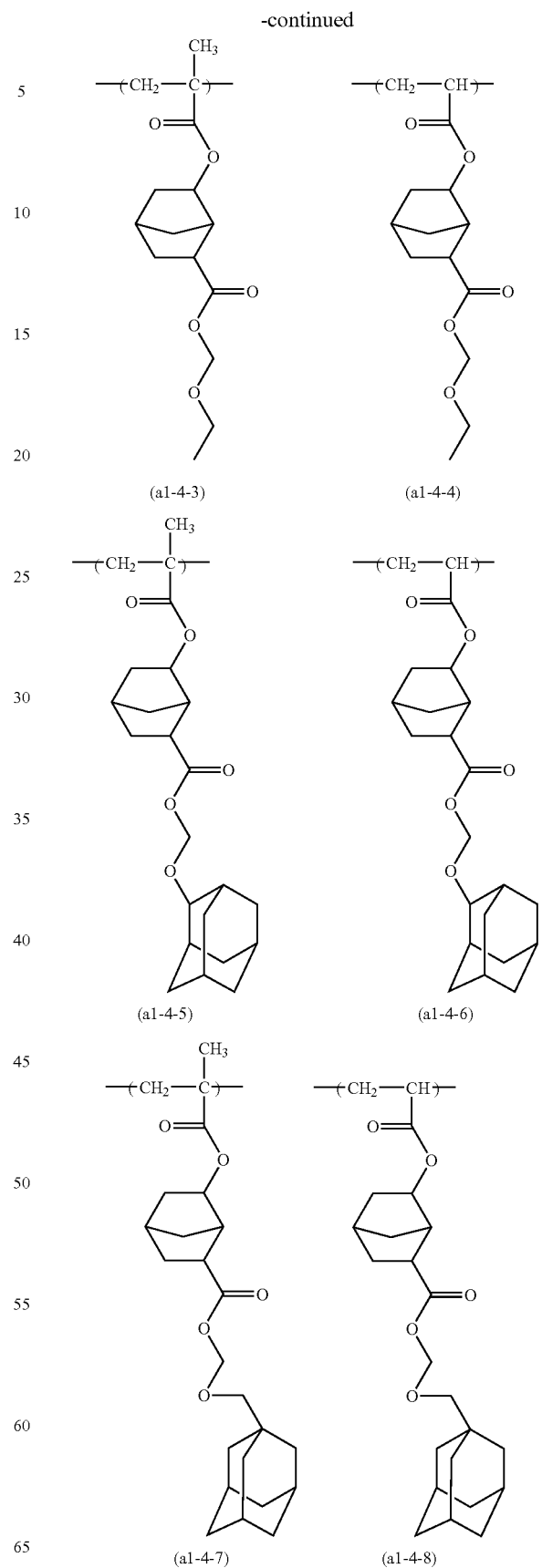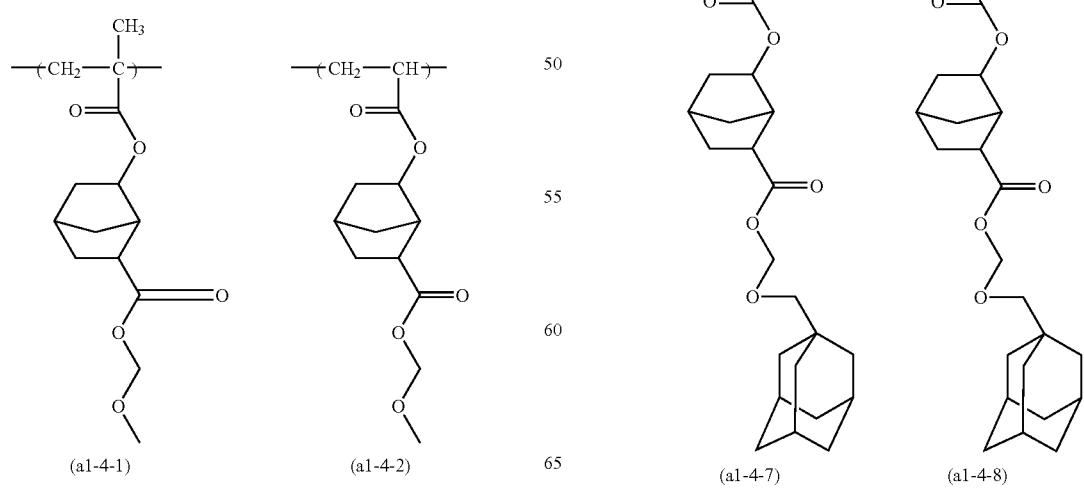

[Chemical Formula 7]
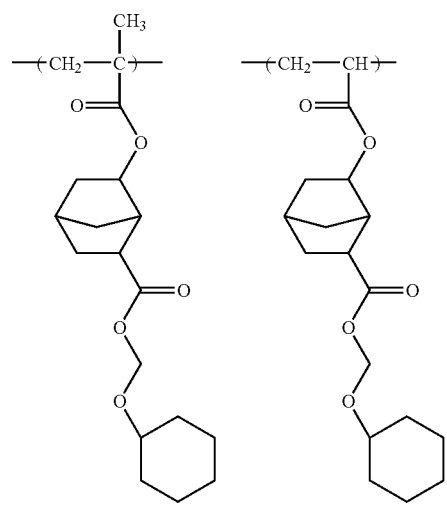
(a1-4-9) (a1-4-10) (a1-4-11) (a1-4-12)
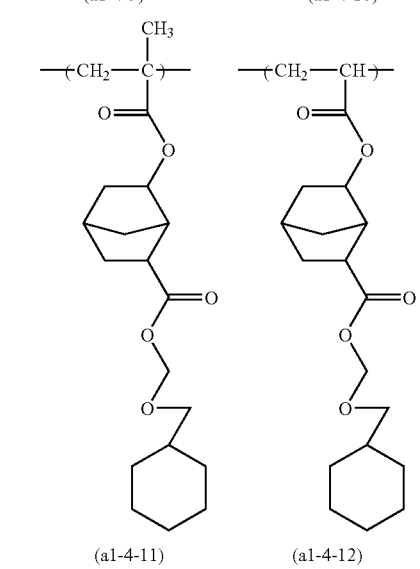
(a1-4-13) (a1-4-14)
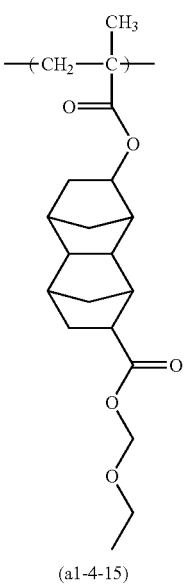
(a1-4-15)
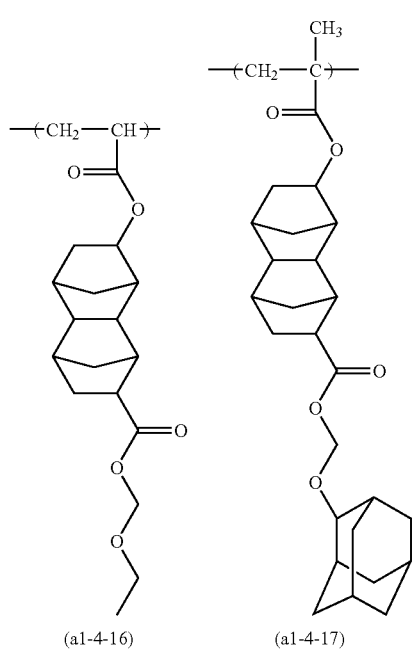
(a1-4-16) (a1-4-17)

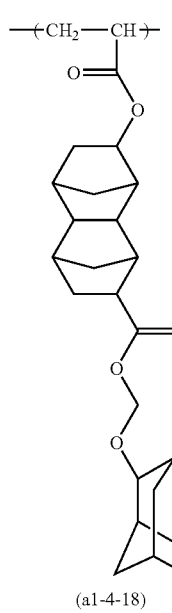
(a1-4-18)
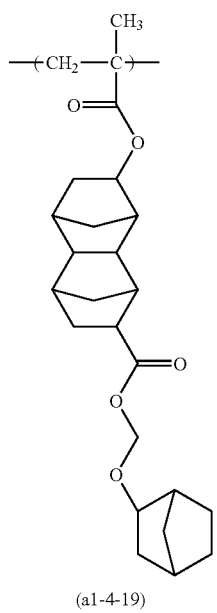
(a1-4-19)
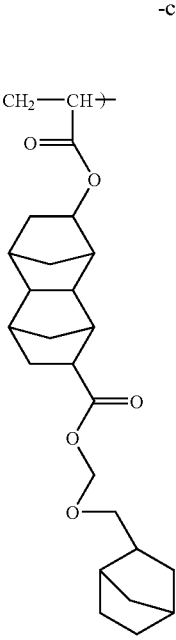
(a1-4-22)
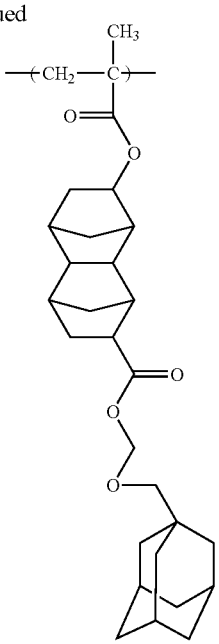
(a1-4-23)
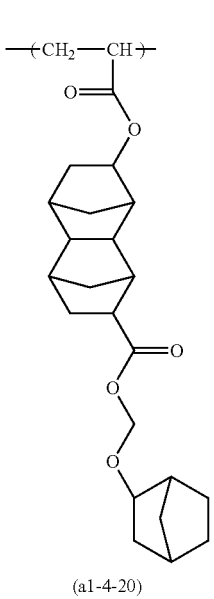
(a1-4-20)
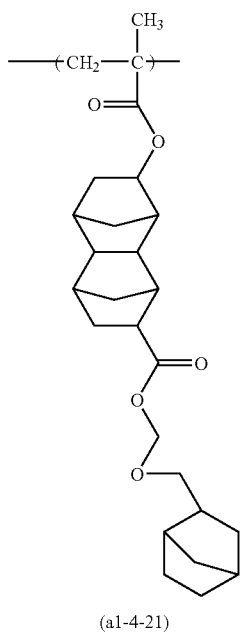
(a1-4-21)
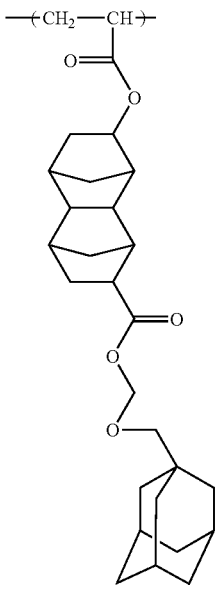
(a1-4-24)
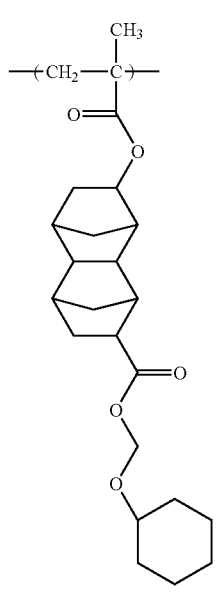
(a1-4-25)

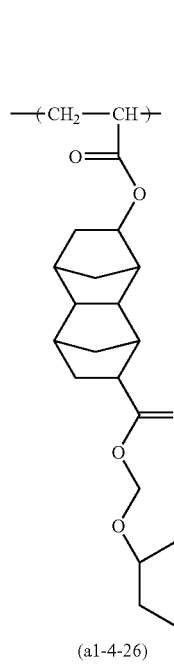
(a1-4-26)

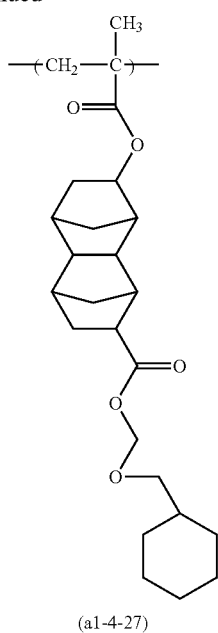
(a1-4-27)

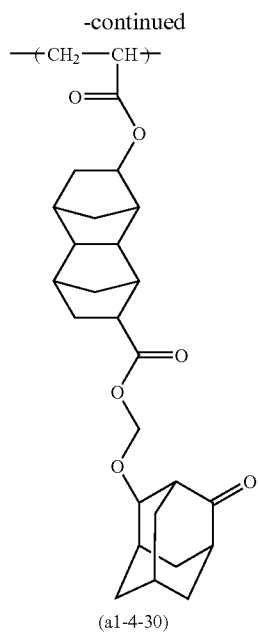
(a1-4-30)

As the structural unit (a1), a structural unit represented by general formula (a1-2) shown above is preferable, and a structural unit represented by general formula (2) shown below is more preferable.

[Chemical Formula 8]

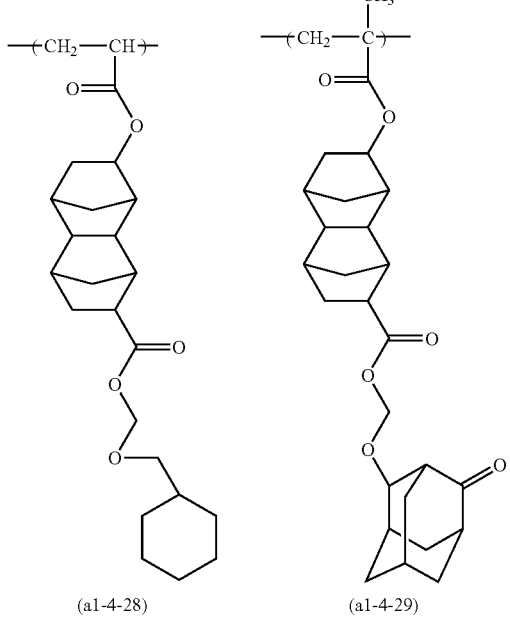
(2)

wherein R represents a hydrogen atom, a fluorine atom, a lower alkyl group or a fluorinated lower alkyl group; n represents 0 or an integer of 1 to 3; X represents a polar group; and l represents 0 or an integer of 1 to 3.

In formula (2), R and n are as defined for formula (a1-2) above.

As a polar group for X, a hydroxyl group, a cyano group, a carboxyl group, or a fluorinated hydroxyalkyl group which is a hydroxyalkyl group of 1 to 5 carbon atoms wherein some of the hydrogen atoms bonded to the carbon atom(s) are substituted with fluorine atoms. Among these, a hydroxyl group or a carboxyl group is preferable. X is not particularly limited to monovalent groups, and an oxygen atom (=O; wherein the

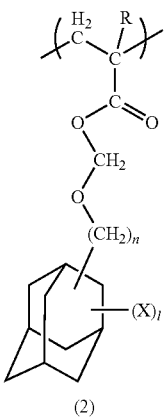
(a1-4-28)    (a1-4-29)

oxygen atom forms a carbonyl group with a carbon atom constituting the ring) is also preferable.

l is preferably 0 or 1, and most preferably 0.

When X is an oxygen atom, the number of oxygen atoms is preferably 1.

Among the structural units represented by general formula (2) above, those which are represented by general formula (3), (4) or (3)' shown below are preferable, and those represented by general formula (3) or (3)' are more preferable.

By including such a structural unit, resolution and the shape of the resist pattern becomes satisfactory.

Further, including such a structural unit is advantageous in that the dependency on the exposure area is improved, and hence, the exposure margin is improved. The exposure margin is the problem of fluctuation in the shape and dimension of a resist pattern, depending on the cover ratio of the mask and the coordination within the cell (i.e., the position in the surrounding or the center portion of the cell within the apparatus). The reason for the improvement in the exposure margin is presumed that an acid dissociable, dissolution inhibiting group represented by the formula: —C($R^{1'}$)($R^{2'}$)—O($CH_2$)$_n$—Y has an extremely low deprotection energy, and hence, the deprotection reaction is likely to proceed only by the exposure energy, and the resist pattern formed is unlikely to be affected by diffusion or deactivation of acid. Furthermore, including such a structural unit is advantageous in that fine resolution and satisfactory shape of the resist pattern can be achieved even when the pattern is formed on an inorganic substrate such as a SiON substrate.

[Chemical Formula 9]

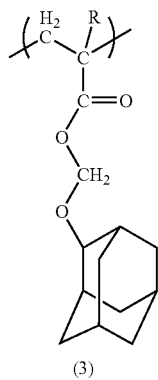

(3)

wherein R represents a hydrogen atom, a fluorine atom, a lower alkyl group or a fluorinated lower alkyl group.

[Chemical Formula 10]

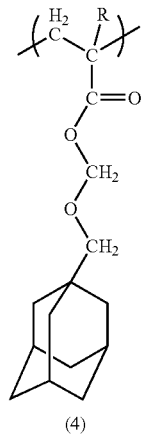

(4)

wherein R represents a hydrogen atom, a fluorine atom, a lower alkyl group or a fluorinated lower alkyl group.

[Chemical Formula 11]

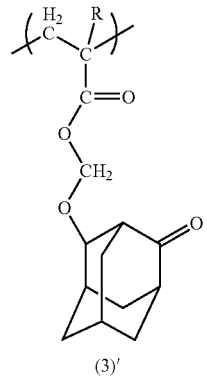

(3)' wherein R represents a hydrogen atom, a fluorine atom, a lower alkyl group or a fluorinated lower alkyl group.

In formulas (3), (4) and (3)', R is as defined for formula (2) above.

As the structural unit (a1), one type of structural unit may be used, or two or more types may be used in combination.

In the copolymer (A1), the amount of the structural unit (a1) based on the combined total of all structural units constituting the copolymer (A1) is preferably 10 to 80 mol %, more preferably 20 to 60 mol %, still more preferably 30 to 50 mol %, and 35 to 45 mol % is particularly desirable. By making the amount of the structural unit (a1) at least as large as the lower limit of the above-mentioned range, a fine pattern can be obtained. On the other hand, by making the amount of the structural unit (a1) no more than the upper limit of the above-mentioned range, a good balance can be achieved with the other structural units.

—Structural Unit (a2)

The structural unit (a2) is a structural unit derived from an acrylate ester having a lactone-containing polycyclic group, which is represented by general formula (a2-1) shown above.

In general formula (a2-1), the R bonded to the carbon atom at the α-position is a hydrogen atom, a fluorine atom, a lower alkyl group or a fluorinated lower alkyl group, and any of those which are the same as the lower alkyl groups or fluorinated lower alkyl groups for R in the structural unit (a1) can be exemplified. Further, the lower alkyl group for R' is the same as the lower alkyl group for R in the structural unit (a1).

The term "lactone-containing polycyclic group" refers to a polycyclic group including one ring containing a —O—C(O)— structure (lactone ring). The term "lactone ring" refers to a single ring containing a —O—C(O)— structure, and this ring is counted as the first ring. A lactone-containing polycyclic group in which the only ring structure is the lactone ring is referred to as a monocyclic group, and groups containing other ring structures are described as polycyclic groups regardless of the structure of the other rings. In the present invention, a polycyclic group is essentially included.

As the structural unit (a2), there is no particular limitation, and an arbitrary unit may be used as long as it has a lactone structure (—O—C(O)—) and any other ring structure. For example, a structural unit can be mentioned in which a polycyclic group having a lactone ring and an alicyclic ring bonded thereto is bonded to the side chain on the ester side of the acrylate ester.

Specific examples of lactone-containing polycyclic groups include groups in which one hydrogen atom has been removed from a lactone ring-containing bicycloalkane, tricycloalkane or tetracycloalkane.

Especially in consideration of industrial availability, groups in which one hydrogen atom has been removed from a lactone-containing tricycloalkane with the type of structural formula shown below are preferable.

More specifically, examples of the structural unit (a2) include structural units represented by general formula (a2-3) or (a2-5) shown below.

[Chemical Formula 12]

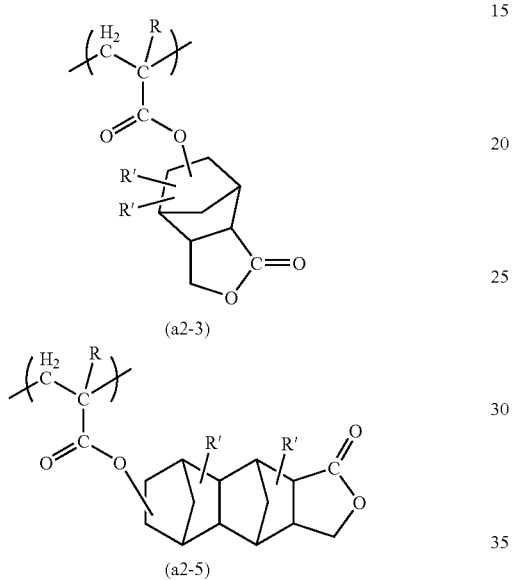

(a2-3)

(a2-5)

wherein R represents a hydrogen atom, a fluorine atom, a lower alkyl group or a fluorinated lower alkyl group; and R' represents a hydrogen atom, a lower alkyl group or an alkoxy group of 1 to 5 carbon atoms.

In general formulas (a2-3) and (a2-5), R is the same as the R in the structural unit (a1).

The lower alkyl group for R' is the same as the lower alkyl group for R in the structural unit (a1).

In the structural units represented by general formula (a2-3) or (a2-5), in consideration of industrial availability, R' is preferably a hydrogen atom.

Specific examples of structural units represented by general formula (a2-3) or (a2-5) above are shown below.

[Chemical Formula 13]

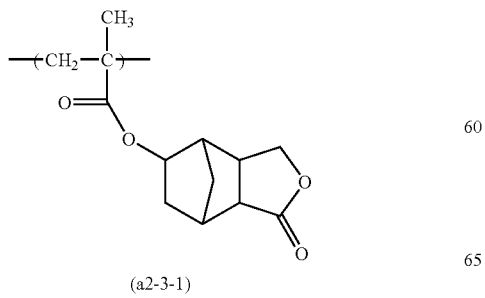

(a2-3-1)

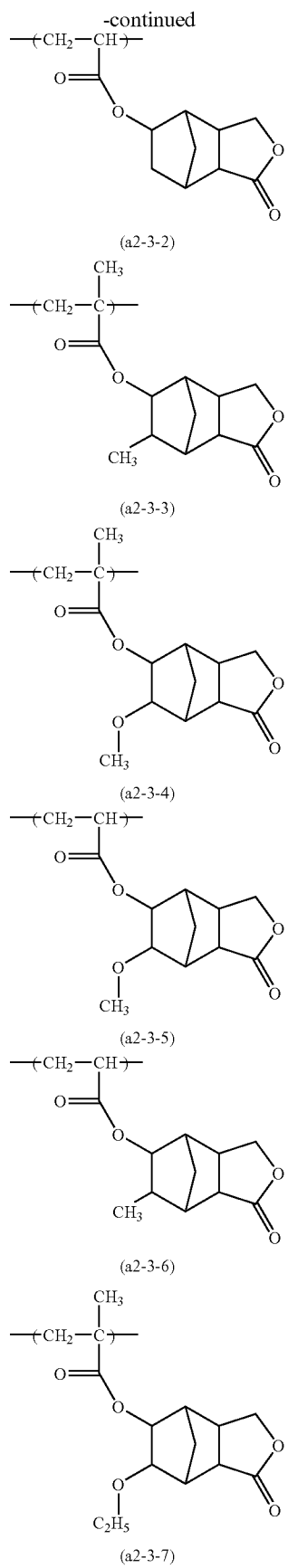

(a2-3-2)

(a2-3-3)

(a2-3-4)

(a2-3-5)

(a2-3-6)

(a2-3-7)

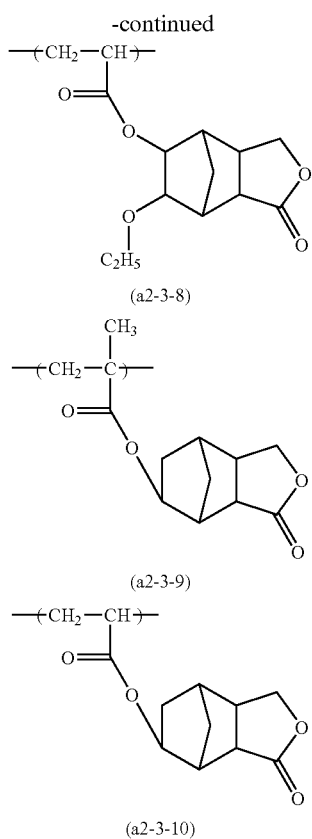

(a2-3-8)

(a2-3-9)

(a2-3-10)

[Chemical Formula 14]

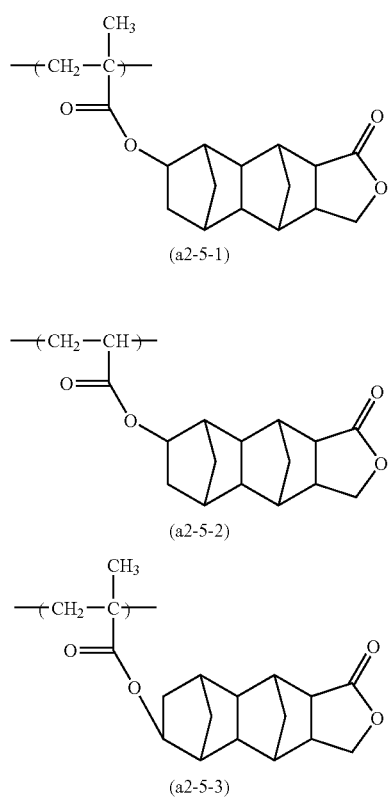

(a2-5-1)

(a2-5-2)

(a2-5-3)

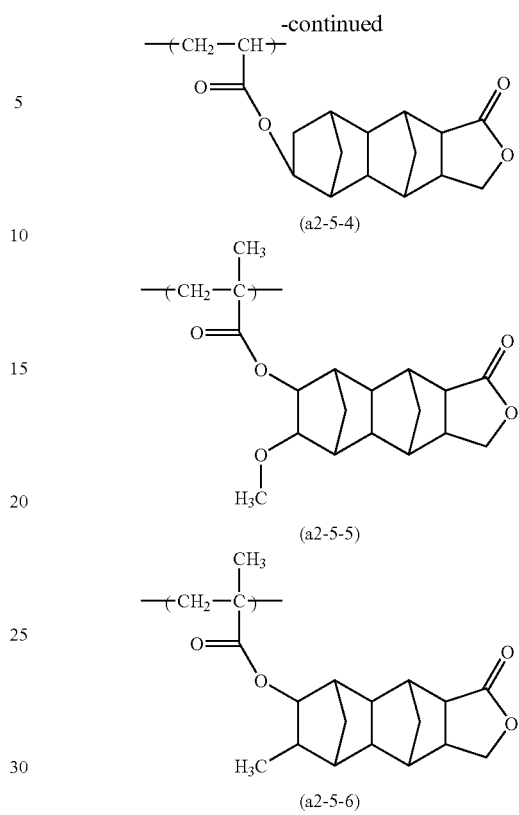

(a2-5-4)

(a2-5-5)

(a2-5-6)

Among these, it is preferable to use at least one structural unit represented by general formula (a2-3), as the shape of the resist pattern formed, especially the rectangularity, becomes satisfactory.

It is more preferable to use at least one structural unit represented by the chemical formula (a2-3-1), (a2-3-2), (a2-3-9) or (a2-3-10).

As the structural unit (a2), one type of structural unit may be used, or two or more types may be used in combination.

In the copolymer (A1), the amount of structural unit (a2) based on the combined total of all structural units constituting the copolymer (A1) is preferably 10 to 80 mol %, more preferably 20 to 60 mol %, still more preferably 25 to 50 mol %, and 35 to 50 mol % is particularly desirable. By making the amount of the structural unit (a2) at least as large as the lower limit of the above-mentioned range, the shape of the pattern, especially the rectangularity becomes satisfactory. On the other hand, by making the amount of the structural unit (a2) no more than the upper limit of the above-mentioned range, a good balance can be achieved with the other structural units.

—Structural Unit (a3)

The structural unit (a3) is a structural unit derived from an acrylate ester which contains a polar group-containing aliphatic hydrocarbon group.

Examples of the polar group include a hydroxyl group, a cyano group, a carboxy group, and a hydroxyalkyl group in which some of the hydrogen atoms of an alkyl group of 1 to 3 carbon atoms are substituted with fluorine atoms, and a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups).

The polycyclic groups can be appropriately selected from various groups which have been proposed for the resins of resist compositions designed for use with ArF excimer lasers. As the structural unit (a3), a structural unit which includes an aliphatic polycyclic group having a hydroxyl group, cyano group, carboxyl group or hydroxyalkyl group in which some of the hydrogen atoms of an alkyl group of 1 to 3 carbon atoms are substituted with fluorine atoms, and is derived from an (α-lower alkyl)acrylate ester, is particularly desirable.

Examples of suitable polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane.

Of these polycyclic groups, groups in which two or more hydrogen atoms have been removed from an adamantyl group, norbornyl group, or tetracyclododecanyl group is preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of (α-lower alkyl)acrylic acid.

On the other hand, when the hydrocarbon group is a polycyclic group, structural units represented by formulas (a3-1), (a3-2), and (a3-3) shown below are preferable.

[Chemical Formula 15]

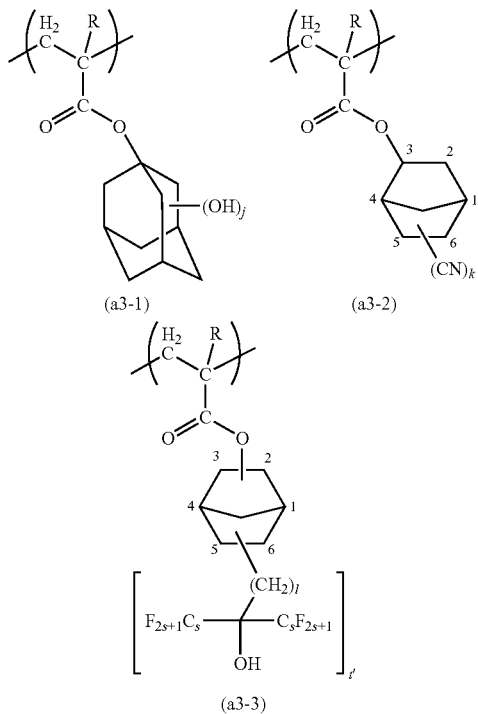

(a3-1)  (a3-2)

(a3-3)

wherein R is a hydrogen atom, a fluorine atom, a lower alkyl group or a fluorinated lower alkyl group; j is an integer of 1 to 3; k is an integer of 1 to 3; t' is an integer of 1 to 3; l is an integer of 1 to 5; and s is an integer of 1 to 3.

In formula (a3-1), R is as defined for formula (a1-2) above.

Further, in formula (a3-1), j is preferably 1 or 2, and more preferably 1. When j is 1, it is particularly desirable that the hydroxyl group be bonded to the 3rd position of the adamantyl group. When j is 2, it is preferable that the hydroxyl groups be bonded to the 3rd and 5th position of the adamantyl group.

In formula (a3-2), R is as defined for formula (a1-2) above.

In formula (a3-2), k is preferably 1. The cyano group is preferably bonded to the 5th or 6th position of the norbonyl group.

In formula (a3-3), R is as defined for formula (a1-2) above.

In formula (a3-3), t' is preferably 1, 1 is preferably 1 and s is preferably 1. Further, in formula (a3-3), it is preferable that a 2-norbornyl group or 3-norbornyl group be bonded to the terminal of the carboxy group of the (α-lower alkyl)acrylic acid.

The fluorinated alkyl alcohol is preferably bonded to the 5th or 6th position of the norbonyl group.

As the structural unit (a3), one type of structural unit may be used, or two or more types may be used in combination.

In the copolymer (A1), the amount of structural unit (a3) based on the combined total of all structural units constituting the copolymer (A1) is preferably 5 to 50 mol %, more preferably 15 to 45 mol %, and most preferably 15 to 35 mol %. By making the amount of the structural unit (a3) at least as large as the lower limit of the above-mentioned range, a resist pattern having an excellent shape can be obtained, and especially, an excellent footing suppression effect can be achieved. On the other hand, by making the amount of the structural unit (a3) no more than the upper limit of the above-mentioned range, a good balance can be achieved with the other structural units.

—Other Structural Units

The copolymer (A1) may further contain a structural unit (a4) which is other than the above-mentioned structural units (a1), (a2) and (a3), as long as the effects of the present invention are not impaired.

As the structural unit (a4), any other structural unit which cannot be classified as one of the above structural units (a1) to (a3) can be used without any particular restrictions, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable.

Specific examples of the structural unit (a4) include units with structures represented by general formulas (a4-1) to (a4-5) shown below.

[Chemical Formula 16]

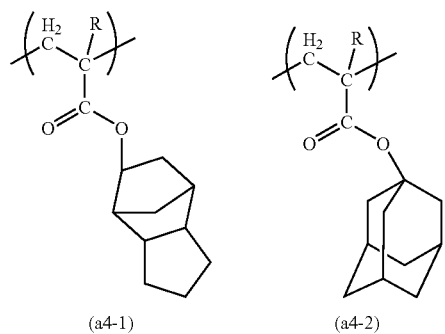

(a4-1)    (a4-2)

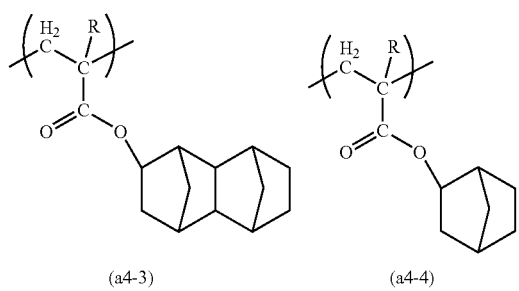

(a4-3)    (a4-4)

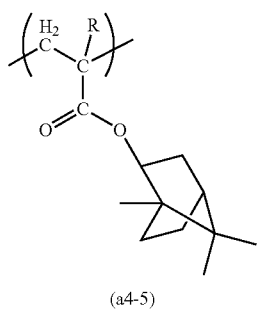

(a4-5)

[Chemical Formula 17]

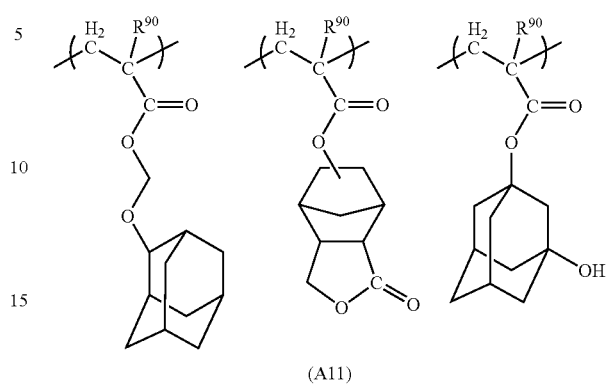

(A11)

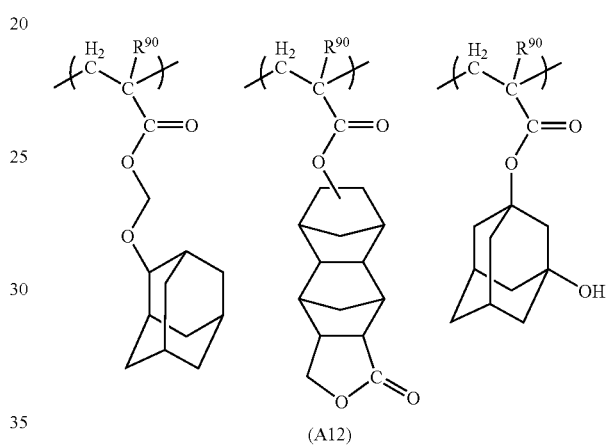

(A12)

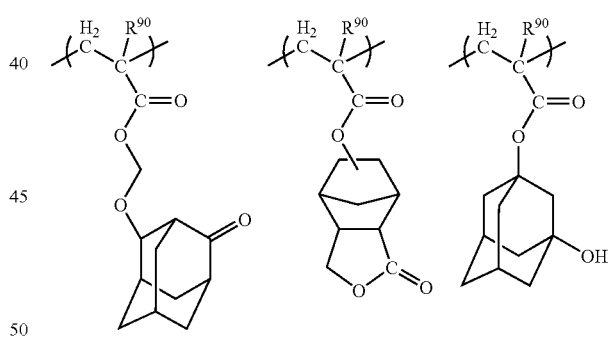

(A13)

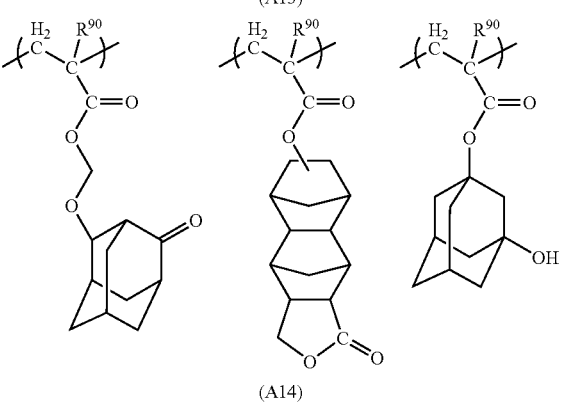

(A14)

wherein R is as defined above.

The structural unit (a4) is not an essential component of the copolymer (A1). However, when the structural unit (a4) is included, the amount of the structural unit (a4) based on the combined total of all the structural units that constitute the copolymer (A1) is typically within a range from 1 to 30 mol %, and preferably from 5 to 20 mol %.

In the present invention, the copolymer (A1) is a copolymer including all of the structural units (a1) to (a3), and is preferably a copolymer containing the structural units (a1) to (a3) as main components.

Here, the term "main component" means that the total amount of structural units (a1) to (a3) based on the combined total of all the structural units that constitute the copolymer (A1) is 70 mol % or more, preferably 80 mol % or more, and still more preferably 90 mol % or more.

As the copolymer (A1), a copolymer consisting of structural units (a1) to (a3) is particularly desirable.

As the preferred combinations of structural units (a1) to (a3) within such a copolymer (A1), those represented by general formulas (A11) to (A16) can be exemplified.

-continued

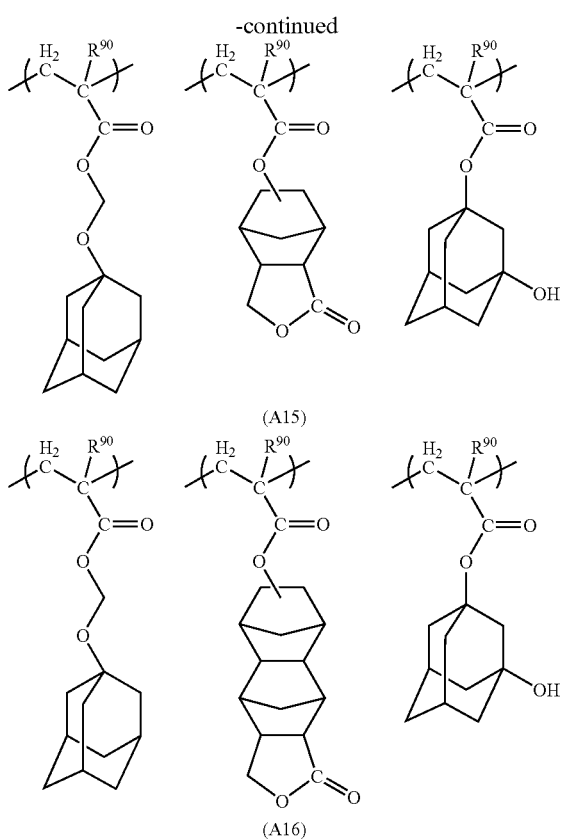

(A15)

(A16)

wherein $R^{90}$ represents a hydrogen atom, a methyl group, a fluorine atom or a trifluoromethyl group.

In general formulas (A11) to (A16) above, $R^{90}$ is preferably a hydrogen atom or a methyl group.

Among general formulas (A11) to (A16) above, general formula (A11) is preferable as the effects of the present invention are further enhanced.

The copolymer (A1) can be obtained, for example, by a conventional radical polymerization or the like of the monomers corresponding with each of the structural units, using a radical polymerization initiator such as azobisisobutyronitrile (AIBN).

Furthermore, in the copolymer (A1), by using a chain transfer agent such as HS—CH$_2$—CH$_2$—CH$_2$—C(CF$_3$)$_2$—OH, a —C(CF$_3$)$_2$—OH group can be introduced at the terminals of the copolymer (A1).

Such a copolymer having introduced a hydroxyalkyl group in which some of the hydrogen atoms of the alkyl group are substituted with fluorine atoms is effective in decreasing developing defects and LER.

The weight average molecular weight (Mw) (the polystyrene equivalent value determined by gel permeation chromatography (GPC)) of the copolymer (A1) is preferably 30,000 or less, more preferably 20,000 or less, and most preferably 15,000 or less. When the weight average molecular weight is 30,000 or less, the resolution is improved, and the effects of the present invention are enhanced. There is no particular limitation of the lower limit of the weight average molecular weight, but in consideration of resolution and solubility in an organic solvent, it is preferably 3,000 or more, and more preferably 5,000 or more.

The dispersity of the copolymer (A1) is preferably 5.0 or less, more preferably from 1.0 to 3.0, and most preferably from 1.0 to 2.5. When the dispersity is within the above-mentioned range, resolution and heat resistance is improved.

As the copolymer (A1), one type of copolymer may be used, or two or more types may be used in combination.

The amount of copolymer (A1) within the component (A) is preferably 70% by weight or more, more preferably 80% by weight or more, and most preferably 100% by weight.

As the component (A), the copolymer (A1) may be used in combination with any other resin such as an alkali-soluble resin conventionally used for positive resist compositions.

In the positive resist composition of the present invention, the amount of the component (A) can be appropriately adjusted depending on the thickness of the resist film to be formed.

<Component (B)>
[(B1) Component]

In the present invention, as the component (B), an onium salt-based acid generator (B1) having a cation moiety represented by general formula (b-1) shown below can be preferably used.

[Chemical Formula 18]

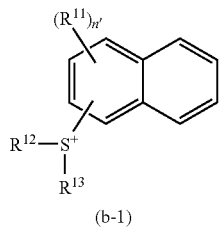

(b-1)

wherein $R^{11}$ represents an alkyl group, an alkoxy group, a halogen atom or a hydroxyl group; $R^{12}$ and $R^{13}$ each independently represents an aryl group or alkyl group which may or may not have a substituent; and n' represents 0 or an integer of 1 to 3.

In general formula (b-11) above, $R^{11}$ represents an alkyl group, an alkoxy group, a halogen atom or a hydroxyl group, and n' represents 0 or an integer of 1 to 3. When n' is 2 or 3, the plurality of $R^{11}$ may be the same or different.

As the alkyl group for $R^{11}$, an alkyl group of 1 to 5 carbon atoms is preferable, and a methyl group, ethyl group, propyl group, n-butyl group or tert-butyl group is particularly desirable.

As the alkoxy group for $R^{11}$, an alkoxy group of 1 to 5 carbon atoms is preferable, and a methoxy group or ethoxy group is particularly desirable.

As the halogen atom for $R^{11}$, a fluorine atom is preferable.

n' is preferable 0 or 1, and more preferably 1.

In general formula (b-1), $R^{12}$ and $R^{13}$ each independently represents an aryl group or alkyl group which may or may not have a substituent.

As the aryl group for $R^{12}$ and $R^{13}$, there is no particular limitation, and examples include aryl groups of 6 to 20 carbon atoms which may or may not have some of the hydrogen atoms substituted with alkyl groups, alkoxy groups, halogen atoms or hydroxyl groups.

As the aryl group, an aryl group of 6 to 10 carbon atoms is preferable as they can be synthesized at a low cost. Specific examples include a phenyl group and a naphthyl group.

When the aryl group has some of the hydrogen atoms substituted, the alkyl group as the substituent is the same as the alkyl group for $R^{11}$.

When the aryl group has some of the hydrogen atoms substituted, the alkoxy group as the substituent is the same as the alkoxy group for $R^{11}$.

When the aryl group has some of the hydrogen atoms substituted, the halogen atom as the substituent is the same as the halogen atoms for $R^{11}$.

As the alkyl group for $R^{12}$ and $R^{13}$, there is no particular limitation. For example, linear, branched or cyclic alkyl groups of 1 to 15 carbon atoms can be mentioned. In consideration of achieving excellent resolution, it is preferable to use alkyl groups of 1 to 5 carbon atoms. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group and a decanyl group. Of these, a methyl group is particularly desirable, as it offers an excellent resolution, and it can be synthesized at a low cost.

It is particularly desirable that both of $R^{12}$ and $R^{13}$ be phenyl groups.

As the anion moiety of the component (B1), there is no particular limitation, and any anion moiety can be appropriately used which is known as an anion moiety of an onium salt-based acid generator.

For example, an anion moiety represented by general formula: $R^{14}SO_3^-$ (wherein $R^{14}$ represents a linear, branched or cyclic alkyl group or fluorinated alkyl group), an anion moiety represented by general formula (b-3) shown below, or an anion moiety represented by general formula (b-4) shown below can be used.

[Chemical Formula 19]

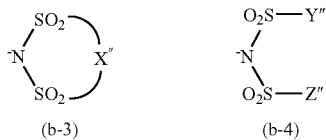

(b-3)                    (b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

In general formula: $R^{14}SO_3^-$, $R^{14}$ represents a linear, branched or cyclic alkyl group or fluorinated alkyl group.

The linear or branched alkyl group for $R^{14}$ preferably has 1 to 10 carbon atoms, more preferably 1 to 8 carbon atoms, and most preferably 1 to 4 carbon atoms.

The cyclic alkyl group for $R^{14}$ is preferably a cyclic group as described for $R^{12}$ and $R^{13}$, preferably having 4 to 15 carbon atoms, more preferably 4 to 10 carbon atoms, and most preferably 6 to 10 carbon atoms.

The fluorinated alkyl group for $R^{14}$ preferably has 1 to 10 carbon atoms, more preferably 1 to 8 carbon atoms, and most preferably 1 to 4 carbon atoms.

A fluorination ratio of the fluorinated alkyl group (percentage of fluorine atoms substituting the hydrogen atoms within the alkyl group, based on the total number of hydrogen atoms within the alkyl group prior to fluorination) is preferably from 10 to 100%, more preferably from 50 to 100%, and it is particularly desirable that all hydrogen atoms are substituted with a fluorine atom, as the acid strength increases.

$R^{14}$" is most preferably a linear or cyclic alkyl or fluorinated alkyl group.

In general formula (b-3) above, X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In general formula (b-4) above, Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the more the solubility in a resist solvent becomes better.

Further, in the alkylene group of X" or the alkyl group of Y" and Z", it is preferable that the number of hydrogen atoms substituted with a fluorine atom is as large as possible, as the acid strength increases. The fluorination ratio the alkylene group or alkyl group is preferably from 70 to 100%, more preferably from 90 to 100%, and it is particularly desirable that the alkylene group or alkyl group a perfluoroalkylene or perfluoroalkyl group in which all hydrogen atoms are substituted with a fluorine atom.

As the anion moiety of the component (B1), an anion moiety represented by general formula (b-3) is particularly desirable, and especially an anion moiety in which X" represents a perfluoroalkylene group.

Preferred examples of the component (B1) are shown below.

[Chemical Formula 20]

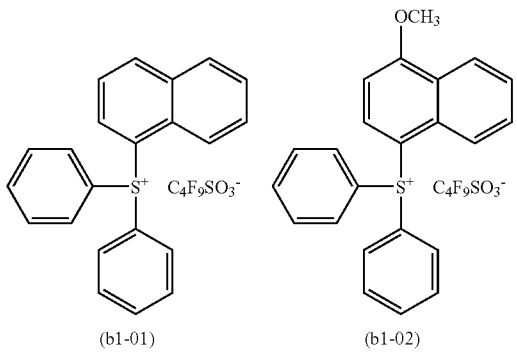

(b1-01)            (b1-02)

(b1-03)            (b1-04)

-continued

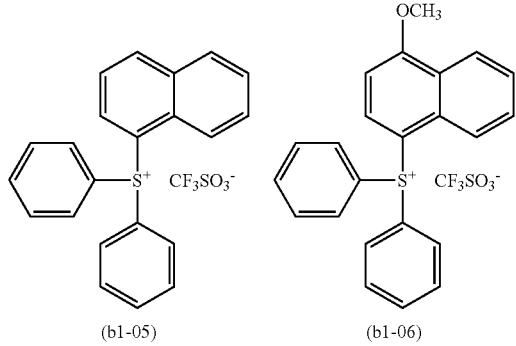

(b1-05)  (b1-06)

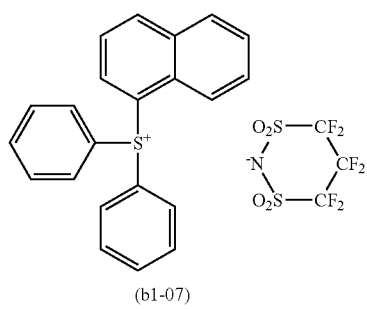

(b1-07)

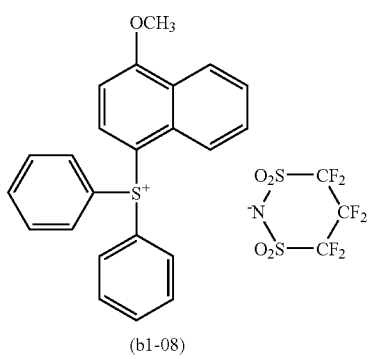

(b1-08)

Among these, an acid generator represented by chemical formula (b1-07) or (b1-08) is particularly desirable.

As the component (B1), one type of acid generator may be used, or two or more types may be used in combination.

The amount of component (B1) within the component (B) is preferably 40% by weight or more, and may be even 100% by weight. The amount of the component (B1) within the component (B) is more preferably 40 to 90% by weight, and most preferably 50 to 85% by weight.

[Component (B2)]

It is preferable that the component (B) include an acid generator (B2) represented by general formula (b-2) shown below, as well as the component (B1). The component (B2) does not overlap the component (B1). In other words, the cation moiety of the component (B2) does not have "a naphthyl group which may have a substituent".

[Chemical Formula 21]

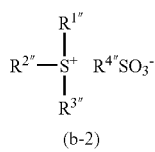

(b-2)

wherein $R^{4\prime\prime}$ represents a linear, branched or cyclic alkyl group or fluorinated alkyl group; and $R^{1\prime\prime}$ to $R^{3\prime\prime}$ each independently represents an aryl group or alkyl group which may have a substituent, with the proviso that at least one of $R^{1\prime\prime}$ to $R^{3\prime\prime}$ represents an aryl group.

In formula (b-2), $R^{1\prime\prime}$ to $R^{3\prime\prime}$ each independently represents an aryl group or an alkyl group which may have a substituent. However, when any one of $R^{1\prime\prime}$ to $R^{3\prime\prime}$ is an aryl group, naphthyl group is excluded.

Among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not specifically limited, as long as it is not a naphthyl group. For example, an aryl group having 6 to 20 carbon atoms may be used in which some or all of the hydrogen atoms of the aryl group may or may not be substituted with an alkyl group, an alkoxy group or a halogen atom. The aryl group is preferably an aryl group having 6 to 10 carbon atoms because it can be synthesized at a low cost. Specific example thereof includes a phenyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group of $R^{1\prime\prime}$ to $R^{3\prime\prime}$ is not specifically limited and includes, for example, a linear, branched or cyclic alkyl group having 1 to 15 carbon atoms. In consideration of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that all of $R^{1\prime\prime}$ to $R^{3\prime\prime}$ are phenyl groups.

$R^{4\prime\prime}$ represents a linear, branched or cyclic alkyl or fluorinated alkyl group.

The linear alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

A fluorination ratio of the fluorinated alkyl group is preferably from 10 to 100%, more preferably from 50 to 100%, and it is particularly desirable that all hydrogen atoms are substituted with a fluorine atom because the acid strength increases.

$R^{4''}$ is most preferably a linear or cyclic alkyl group or fluorinated alkyl group.

Specific examples of the component (B) include: trifluoromethanesulfonate of triphenylsulfonium, heptafluoropropanesulfonate thereof or nonafluorobutanesulfonate thereof; trifluoromethanesulfonate of tri(4-methylphenyl)sulfonium, heptafluoropropanesulfonate thereof or nonafluorobutanesulfonate thereof; trifluoromethanesulfonate of monophenyldimethylsulfonium, heptafluoropropanesulfonate thereof or nonafluorobutanesulfonate thereof; trifluoromethanesulfonate of diphenylmonomethylsulfonium, heptafluoropropanesulfonate thereof or nonafluorobutanesulfonate thereof; trifluoromethanesulfonate of (4-methylphenyl)diphenylsulfonium, heptafluoropropanesulfonate thereof or nonafluorobutanesulfonate thereof; trifluoromethanesulfonate of (4-methoxyphenyl)diphenylsulfonium, heptafluoropropanesulfonate thereof or nonafluorobutanesulfonate thereof; and trifluoromethanesulfonate of tri(4-tert-butyl)phenylsulfonium, heptafluoropropanesulfonate thereof or nonafluorobutanesulfonate thereof.

It is also possible to use onium salts in which the anion moiety of these onium salts are replaced by methanesulfonate, n-propanesulfonate, n-butanesulfonate, or n-octanesulfonate.

As the component (B32), one type of structural unit may be used, or two or more types may be used in combination.

When the component (B2) is used, the amount of the component (B2) within the component (B) is preferably 10 to 60% by weight, more preferably 15 to 50% by weight, and most preferably 20 to 40% by weight.

[Other Acid Generator (B3)]

The component (B) may further include a conventional acid generator used in a chemically amplified resist composition (hereafter, frequently referred to as "other acid generator (B3)"). However, in consideration of the effects of the present invention, it is preferable that the total amount of the component (B1) and the component (B2) in the component (B) is 80% by weight or more, and more preferably 100% by weight.

As the other acid generator (B3), any acid generator conventionally known can be used. Examples include onium salt-based acid generators other than the onium salt-based acid generators (B1) and (B2) (e.g., iodonium salts); oxime sulfonate-based acid generators; diazomethane-based acid generators such as bisalkyl or bisarylsulfonyl diazomethanes and poly(bissulfonyl)diazomethanes; nitrobenzylsulfonate-based acid generators; iminosulfonate-based acid generators; and disulfone-based acid generators.

As the component (B3), one type of acid generator may be used, or two or more types may be used in combination.

The amount of the component (B) contained in the positive resist composition of the present invention is preferably 2 to 20 parts by weight, more preferably 5 to 15 parts by weight, and most preferably 5 to 13 parts by weight, relative to 100 parts by weight of the component (A). When the amount of the component (B) is within the above-mentioned range, formation of a pattern can be satisfactorily performed, and excellent properties can be obtained. Further, a uniform solution can be obtained, and hence, the storage stability is excellent.

<Organic Solvent (S)>

The positive resist composition of the present invention can be prepared by dissolving a component (A), a component (B) and optionally other components in an organic solvent (S).

The organic solvent (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, and monomethylether, monoethylether, monopropylether, monobutylether or monophenylether of any of these polyhydric alcohols; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

Among these, propylene glycol monomethyl ether (PGME) is preferable, as it suppresses footing, and a pattern having a high rectangularity can be obtained.

Further, among the mixed solvents, a mixed solvent obtained by mixing propylene glycol monomethyl ether acetate (PGMEA) with a polar solvent is preferable. The mixing ratio (weight ratio) of the mixed solvent can be appropriately determined, taking into consideration the compatibility of the PGMEA with the polar solvent, but is preferably from 1:9 to 9:1, more preferably from 2:8 to 8:2.

Examples of the polar solvent include PGME and EL, although PGME is preferable.

When PGME is mixed as the polar solvent, the PGMEA:PGME weight ratio is preferably from 9:1 to 1:9, more preferably from 8:2 to 2:8, and most preferably from 7:3 to 4:6.

Alternatively, when EL is mixed as the polar solvent, the PGMEA:EL weight ratio is preferably from 1:9 to 9:1, and more preferably from 2:8 to 8:2.

Further, a mixed solvent of at least one of PGMEA and EL with γ-butyrolactone is also preferable. The mixing ratio (former:latter) of such a mixed solvent is preferably from 70:30 to 95:5.

The amount of the organic solvent (S) is not particularly limited, and is appropriately adjusted to a concentration which enables coating of a coating solution to a substrate, depending on the thickness of the coating film. In general, the organic solvent (S) is used in an amount such that the solid content of the resist composition becomes within the range from 2 to 20% by weight, and preferably from 5 to 15% by weight.

<Other Optional Components>

In the positive resist composition of the present invention, for improving the resist pattern shape and the post exposure stability of the latent image formed by the pattern-wise exposure of the resist layer, it is preferable to add a nitrogen-containing organic compound (D) (hereafter referred to as the component (D)).

A multitude of these components (D) have already been proposed, and any of these known compounds may be used, although an aliphatic amine, and particularly a secondary aliphatic amine or tertiary aliphatic amine is preferable.

Examples of these aliphatic amines include amines in which at least one hydrogen atom of ammonia ($NH_3$) has been substituted with a linear, branched or cyclic alkyl group or hydroxyalkyl group of not more than 12 carbon atoms (i.e., alkylamines or alkyl alcohol amines).

Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, alkyl alcohol amines and trialkyl amines are preferable, and alkyl alcohol amines are particularly desirable. Among alkyl alcohol amines, triethanolamine and triisopropanolamine are preferable.

These compounds can be used either alone, or in combinations of two or more different compounds.

The component (D) is typically used in an amount within a range from 0.01 to 5.0 parts by weight, relative to 100 parts by weight of the component (A).

Furthermore, in the positive resist composition of the present invention, for preventing any deterioration in sensitivity caused by the addition of the above component (D), and improving the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component.

The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Method for Forming a Resist Pattern>

The method for forming a resist pattern according to the present invention can be performed, for example, as follows.

Firstly, a positive resist composition according to the present invention is applied to a substrate such as a silicon wafer using a spinner or the like, and a prebake is conducted under temperature conditions of 80 to 150° C. for 40 to 120 seconds, preferably 60 to 90 seconds.

Then, using an ArF exposure apparatus or the like, the resulting film is selectively exposed to an ArF excimer laser beam through a desired mask pattern, followed by post exposure bake (PEB) under temperature conditions of 80 to 150° C. for 40 to 120 seconds, preferably 60 to 90 seconds.

Subsequently, developing is conducted using an alkali developing solution such as a 0.1 to 10% by weight aqueous solution of tetramethylammonium hydroxide. If desired, PEB can be conducted following the developing.

In this manner, a resist pattern that is faithful to the mask pattern can be obtained.

An organic or inorganic anti-reflective film may also be provided between the substrate and the applied layer of the resist composition.

The wavelength to be used for exposure (radiation) is not particularly limited and the exposure can be conducted using radiations such as ArF excimer laser, KrF excimer laser, $F_2$ laser, extreme ultraviolet rays (EUV), vacuum ultraviolet rays (VUV), electron beam, X-rays, and soft X-rays.

The positive resist composition of the present invention is particularly effective to ArF excimer laser.

As described above, by the positive resist composition and method of forming a resist pattern according to the present invention, a resist pattern having an excellent shape can be obtained. Especially, in the present invention, not only can the footing of the pattern be suppressed, but also a pattern having a high cross-sectional rectangular formability can be obtained. When a pattern is formed on an organic antireflection film such as a neutral bottom anti-reflection coating (BARC) which is generally formed as a lower layer for a resist, it is highly possible that footing occurs. However, even then footing can be suppressed and a resist pattern having an excellent shape can be obtained.

The reason for this is not clear, but it is presumed that the properties of the structural units (a1) to (a3) of the copolymer (A1) are giving great contribution to achieving such effects.

In the copolymer (A1), the acid dissociable, dissolution inhibiting group (protection group) of the structural unit (a1) exhibits a low activation energy during the deprotection reaction of the protection group dissociating by the action of acid generated from the component (B), and thus, is easily dissociated. Therefore, it is presumed that the acid dissociable, dissolution inhibiting group is easily dissociated and the alkali solubility of the entire resist is enhanced, and hence, the resolution is improved and the formation of a resist pattern can be satisfactorily performed.

Further, the structural unit (a2) has a bulky lactone structure including 2 or 3 rings. Therefore, it is presumed that the diffusion of the acid is suppressed, and hence, the rectangularity is improved, and footing is suppressed.

Furthermore, the structural unit (a3) is a hydrophilic unit having a polar group. It is presumed that the dissolution rate of the resist composition to an alkali solution is enhanced by the hydrophilicity of the structural unit (a3), and as a result, the solubility is not biased especially at the substrate interface, and hence, footing can be suppressed.

Still further, by using PGME (which is a polar solvent) as the organic solvent (S), it is presumed that the hydrophilicity of the resist composition is enhanced, and suppression of footing can be more reliably achieved.

In addition, in the present invention, the surface roughness of the side walls of the side walls of the resist pattern called "line edge roughness (LER)" can be reduced, which is presumed to be an effect achieved mainly by structural unit (a2).

Further, the glass transition temperature of the resin component becomes higher, and hence, heat resistance is improved.

EXAMPLES

As follows is a description of examples of the present invention, although the scope of the present invention is by no way limited by these examples.

<Component (A)>

[Synthesis of Monomer]

Synthesis of (2-adamantyloxymethyl)methacrylate 6.9 g of methacrylic acid was dissolved in 200 ml of tetrahydrofuran, and 8.0 g of triethylamine was added thereto. Then, the resultant was stirred at room temperature, and 100 ml of tetrahydrofuran having 15 g of 2-adamantyl chloromethyl ether dissolved was dropwise added.

Following 12 hours of stirring at room temperature, the precipitated salt was separated by filtration. Then, the filtrate was subjected to distillation to distill off the solvent, and was dissolved in 200 ml of ethyl acetate. The resultant was washed with pure water (100 ml×3), followed by distilling off the solvent.

The resultant was allowed to stand while cooling with ice, thereby obtaining a white solid.

The results of the infrared absorption spectroscopy (IR) and the proton nuclear magnetic resonance spectroscopy ($^1$H-NMR) are shown below.

IR (cm$^{-1}$): 2907, 2854 (C—H stretching), 1725 (C=O stretching), 1638 (C=C stretching) $^1$H-NMR (CDCl$_3$, internal standard: tetramethylsilane) ppm: 1.45-2.1 (m, 17H), 3.75 (s, 1H), 5.45 (s, 2H), 5.6 (s, 1H), 6.12 (s, 1H)

The obtained compound ((2-adamantyloxymethyl)methacrylate) is represented by the chemical formula shown below.

[Chemical Formula 22]

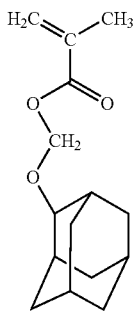

[Synthesis of Resin (A)-1]

20.0 g of the (2-adamantyloxymethyl)methacrylate monomer obtained by the synthesis as described above, 18.9 g of norbornanclactone methacrylate and 9.5 g of 3-hydroxy(1-adamantyl)methacrylate were dissolved in 200 ml of tetrahydrofuran, and 1.64 g of azobisisobutyronitrile was added thereto.

The resultant was refluxed for 12 hours, and the reaction solution was dropwise added to 2 L of n-heptane.

The precipitated resin was collected by filtration, and was dried under reduced pressure, thereby obtaining a white resin powder (resin (A)-1).

The structural formula of the obtained resin (A)-1 is shown below.

As a result of the GPC measurement, the weight average molecular weight (Mw) of the resin (A-1) was 7,000, and the dispersity (Mw/Mn) was 2.0.

Further, as a result of the carbon 13 nuclear magnetic resonance spectroscopy ($^{13}$C-NMR), it was found that the resin (A)-1 had a compositional ratio (molar ratio) between each of the structural units shown in the structural formula below of a2:b2:c2=4:4:2.

[Chemical Formula 23]

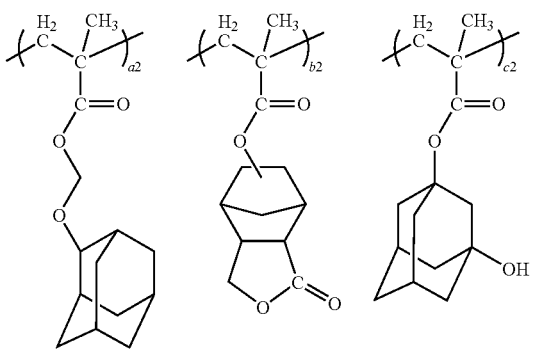

Resin (A)-1

[Synthesis of Resin (A)-2]

Resin (A)-2 was synthesized in substantially the same manner as in the synthesis of resin (A)-1, except that 18.7 g of 2-methyl-(2-adamantyl)methacrylate, 13.6 g of γ-butyrolactone and 9.5 g of 3-hydroxy-(1-adamantyl)methacrylate were used.

As a result of the GPC measurement, the weight average molecular weight (Mw) of the resin (A-2) was 10,000, and the dispersity (Mw/Mn) was 2.0.

Further, as a result of the carbon 13 nuclear magnetic resonance spectroscopy ($^{13}$C-NMR), it was found that the resin (A)-2 had a compositional ratio (molar ratio) between each of the structural units shown in the structural formula below of a3:b3:c3=4:4:2.

[Chemical Formula 24]

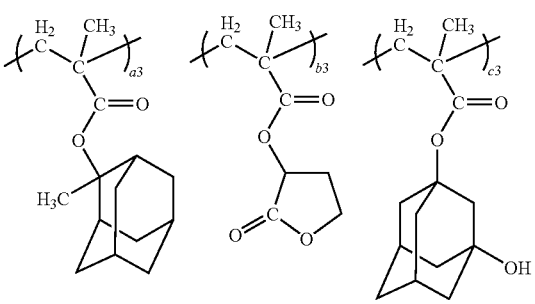

Resin (A)-2

[Synthesis of Resin (A)-3]

Resin (A)-3 was synthesized in substantially the same manner as in the synthesis of resin (A)-1, except that 20.0 g of the (2-adamantyloxymethyl)methacrylate monomer obtained by the synthesis as described above, 18.9 g of norbornanelactone methacrylate and 8.8 g of tricyclodecanyl methacrylate were used.

As a result of the GPC measurement, the weight average molecular weight (Mw) of the resin (A-3) was 7,000, and the dispersity (Mw/Mn) was 2.0.

Further, as a result of the carbon 13 nuclear magnetic resonance spectroscopy ($^{13}$C-NMR), it was found that the resin (A)-3 had a compositional ratio (molar ratio) between each of the structural units shown in the structural formula below of a1:b1:c1=4:4:2.

[Chemical Formula 25]

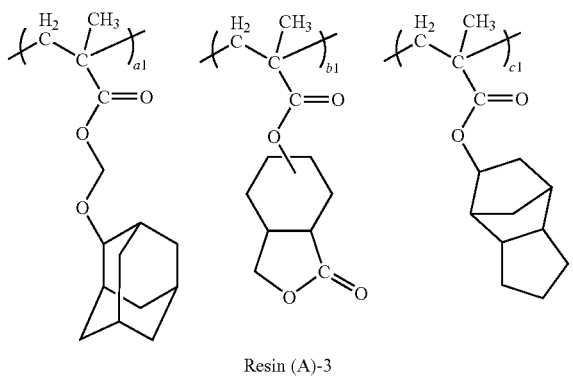

Resin (A)-3

Example 1 and Comparative Examples 1 and 2

The components indicated in Table 1 were mixed together and dissolved, thereby obtaining a positive resist composition solution.

In Table 1, the value within the bracket [ ] indicates the blend quantity (parts by weight).

TABLE 1

|  | (A) | (B) | (S) | (D) |
|---|---|---|---|---|
| Example 1 | (A)-1 | (B)-1 | (S1) | (D)-1 |
|  | [100] | [1.6] | [750] | [0.30] |
|  |  | (B)-2 |  |  |
|  |  | [3.0] |  |  |
| Comparative | (A)-2 | (B)-1 | (S1) | (D)-1 |
| Example 1 | [100] | [2.0] | [750] | [0.25] |
| Comparative | (A)-3 | (B)-1 | (S1) | (D)-1 |
| Example 2 | [100] | [1.6] | [750] | [0.30] |
|  |  | (B)-2 |  |  |
|  |  | [3.0] |  |  |

<Component (B)>
(B)-1: (4-methylphenyl)diphenylsulfonium nonafluorobutanesulfonate
(B)-2:

[Chemical Formula 26]

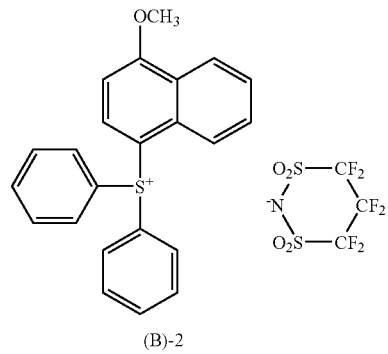

(B)-2

<Organic Solvent (S)>
(S1): Mixed solvent with PGMEA/PGME ratio (weight ratio) of 6/4
<Component (D)>
(D)-1: triethanolamine
<Evaluation>
Using the obtained positive resist composition, evaluation was performed as follows.

An organic antireflection film composition "AR46" (trade name; manufactured by Rohm and Haas) was applied onto an 8 inch silicon wafer using a spinner. Then, the silicon wafer was sintered and dried on a hot plate at 215° C. for 60 seconds, thereby forming an organic antireflection film having a thickness of 31 nm.

The positive resist composition obtained in the manner as described above was applied onto the antireflection film using a spinner. Then, post applied bake (PAB) was conducted on a hot plate at a PAB temperature indicated in Table 2 for 90 seconds to dry the positive resist composition, thereby forming a resist film having a thickness of 180 nm.

Subsequently, using an ArF exposure apparatus NSR-S306C (manufactured by Nikon; numerical aperture=0.78, Dipole), an ArF excimer laser (193 nm) was selectively irradiated through a mask pattern (6% transparent half tone mask).

Thereafter, the irradiated resist film was subjected to post exposure bake (PEB) at a PEB temperature indicated in Table 2 for 90 seconds, followed by paddle development for 60 seconds at 23° C. in a 2.38% by weight aqueous solution of tetramethylammonium hydroxide (TMAH). Then, the resulting resist film was washed for 30 seconds and dried, followed by conducting post bake at 100° C. for 60 seconds, thereby forming a line and space pattern (hereafter, referred to as "L/pattern") with 80 nm 1:1 line and space.

TABLE 2

|  | PAB temperature (° C.) | PEB temperature (° C.) |
|---|---|---|
| Example 1 | 125 | 130 |
| Comparative Example 1 | 120 | 135 |
| Comparative Example 2 | 120 | 125 |

The exposure dose (sensitivity) with which a 80 nm L/S pattern having a line width:space width ratio of 1:1 was formed was defined as Eop, and LER, footing and shape (rectangularity) of a 80 nm L/S pattern (1:1) obtained with the Eop were evaluated.

The results of the evaluation are shown in Table 3.

<LER>

The 3σ value, which is a measure of the LER, was determined.

The 3σ value is determined by measuring the resist pattern width of the sample at 32 positions using a measuring SEM (product name: S-9360, manufactured by Hitachi, Ltd.), and calculating the value of 3 times the standard deviation σ (i.e., 3σ) from the measurement results. The smaller this 3σ value is, the lower the level of roughness, indicating a resist pattern with a uniform width. The measurement voltage was 300V.

<Footing>

With respect to the 80 nm L/S pattern (1:1), the shape of the pattern near the substrate interface was evaluated using a measuring SEM with the following criteria.
 ⊚: The pattern is extremely perpendicular
 ○: The pattern is almost perpendicular
 x: The pattern is spread <Shape (Rectangularity)>

With respect to the 80 nm L/S pattern (1:1), the cross-section was evaluated using a measuring SEM with the following criteria.
 ⊚: The cross-section is extremely rectangular
 ○: The cross-section is rectangular
 x: The pattern has a rounded top

TABLE 3

|  | Example 1 | Comparative Example 1 | Comparative Example 2 |
|---|---|---|---|
| LER (3σ) | 6.4 nm | 7.6 nm | 7.1 nm |
| Footing | ⊚ | X | X |
| Shape (rectangularity) | ⊚ | X | ○ |

As seen from the results shown in Table 3, with respect to the pattern formed using the resist composition obtained in Example 1 in which the component (A) as defined in the present invention was used, the LER was reduced and footing was significantly suppressed, as compared to Comparative Examples 1 and 2 in which the component (A) was not used. Further, the rectangularity was high, and the resist pattern had an excellent shape.

On the other hand, with respect to the patterns formed using the resist composition obtained in Comparative Examples 1 and 2, LER was large, and the pattern badly suffered footing, and the shape of the resist pattern was extremely poor.

From the above, it was confirmed that a positive resist composition which enable formation of a resist pattern having an excellent shape and a method of forming a resist pattern can be provided by the present invention.

INDUSTRIAL APPLICABILITY

According to the present invention, there are provided a positive resist composition which enable formation of a resist pattern having an excellent shape and a method of forming a resist pattern.

The invention claimed is:

1. A positive resist composition comprising a resin component (A) which exhibits increased alkali solubility under action of acid, an acid-generator component (B) which generates acid upon irradiation and an organic solvent (S) in which said components (A) and (B) are dissolved, said resin component (A) comprising a copolymer (A1) comprising:

a structural unit (a1) which is at least one member selected from the group consisting of structural units represented by general formula (a1-2) or (a1-4) shown below:

[Chemical Formula 1]

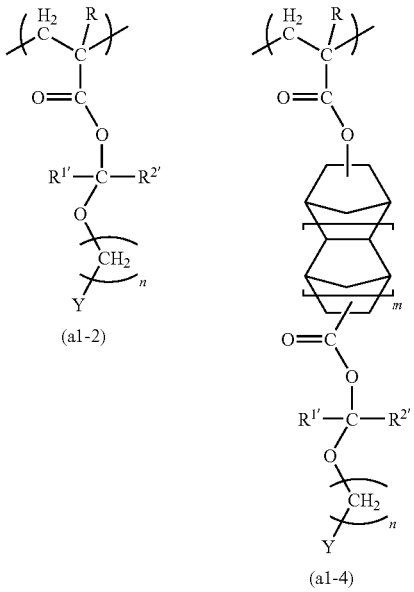

(a1-2)

(a1-4)

wherein Y represents a lower alkyl group or an aliphatic cyclic group; n represents 0 or an integer of 1 to 3; m represents 0 or 1; R represents a hydrogen atom, a fluorine atom, a lower alkyl group or a fluorinated lower alkyl group; and $R^{1'}$ and $R^{2'}$ each independently represents a hydrogen atom or a lower alkyl group;

a structural unit (a2) derived from an acrylate ester having a lactone-containing polycyclic group, said structural unit (a2) being represented by general formula (a2-1) shown below:

[Chemical Formula 2]

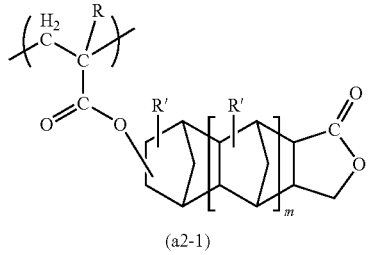

(a2-1)

wherein R represents a hydrogen atom, a fluorine atom, a lower alkyl group or a fluorinated lower alkyl group; R' represents a hydrogen atom, a lower alkyl group or an alkoxy group of 1 to 5 carbon atoms; and m represents 0 or 1; and a structural unit (a3) derived from an acrylate ester having a polar group-containing aliphatic hydrocarbon group, wherein the amount of structural unit (a2) based on the combined total of all structural units constituting the copolymer (A1) is 25 to 50 mol %, wherein said acid-generator component (B) is an onium salt-based acid generator (B1) which comprises a cation moiety represented by general formula (b-1) shown below and an anion moiety represented by a general formula (b-3) or (b-4) shown below:

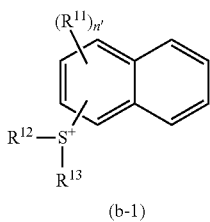

(b-1)

wherein $R^{11}$ represents an alkyl group, an alkoxy group, a halogen atom or a $R^{12}$ and $R^{13}$ each independently alkyl group which may or may not have a substituent; and n' represents 0 or an integer of 1 to 3;

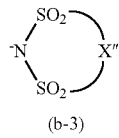

(b-3)

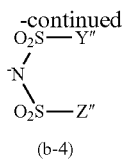

(b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

2. The positive resist composition according to claim 1, wherein said organic solvent (S) comprises propylene glycol monomethyl ether.

3. The positive resist composition according to claim 2, wherein said organic solvent (S) further comprises propylene glycol monomethyl ether acetate.

4. The positive resist composition according to claim 1, which further comprises a nitrogen-containing organic compound (D).

5. A method of forming a resist pattern, comprising: applying a positive resist composition of claim 1 to a substrate to form a resist film on the substrate; conducting exposure of said resist film; and developing said resist film to form a resist pattern.

* * * * *

UNITED STATES PATENT AND TRADEMARK OFFICE
CERTIFICATE OF CORRECTION

| | | |
|---|---|---|
| PATENT NO. | : 7,858,286 B2 | Page 1 of 2 |
| APPLICATION NO. | : 11/913308 | |
| DATED | : December 28, 2010 | |
| INVENTOR(S) | : Kinoshita et al. | |

It is certified that error appears in the above-identified patent and that said Letters Patent is hereby corrected as shown below:

Column 1, Lines 58-59, change "nm n." to --nm.--.

Column 2, Line 19 (Approx.), change "I]" to --1]--.

Column 2, Line 20 (Approx.), after "2,881,969" insert --.--.

Column 2, Line 21 (Approx.), change "1]" to --1]--.

Column 2, Line 22 (Approx.), after "483-488" insert --.--.

Column 5, Line 43, change "A," to --Y,--.

Column 19, Line 3, change "1" to --l--.

Column 25, Line 66, change "1" to --l--.

Column 26, Line 14, change "1" to --l--.

Column 30, Line 40, change "(b-11)" to --(b-1)--.

Column 34, Line 1, change "21" to --21]--.

Column 34, Line 16, change "R''''" to --$R^{1''}$--.

Column 35, Line 33, change "(B32)," to --(B2),--.

Column 39, Line 34, (Approx.), after "1H)" insert --.--.

Column 39, Lines 42-53, change " 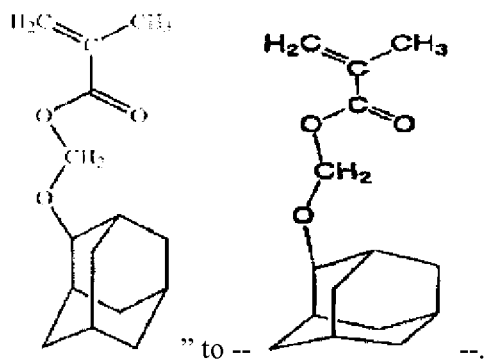 " to -- --.

Column 39, Line 59 (Approx.), change "norbornanclactone" to --norbornanelactone--.

Signed and Sealed this
Twenty-third Day of August, 2011

David J. Kappos
*Director of the United States Patent and Trademark Office*

CERTIFICATE OF CORRECTION (continued)
U.S. Pat. No. 7,858,286 B2

Column 42, Line 57 (Approx.), change ""L/pattern")" to --"L/S pattern")--.

Column 44, Line 40, in Claim 1, change "$R^{1'}$and $R^{2'}$each" to --$R^{1'}$ and $R^{2'}$ each--.

Column 45, Line 22 (Approx.), in Claim 1, change "a" to --a hydroxyl group;--.

Column 45, Line 22 (Approx.), in Claim 1, change "independently" to --independently represents an aryl group or--.